(12) United States Patent
Awano

(10) Patent No.: US 7,084,507 B2
(45) Date of Patent: Aug. 1, 2006

(54) INTEGRATED CIRCUIT DEVICE AND METHOD OF PRODUCING THE SAME

(75) Inventor: Yuji Awano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/107,480

(22) Filed: Mar. 28, 2002

(65) Prior Publication Data

US 2002/0163079 A1 Nov. 7, 2002

(30) Foreign Application Priority Data

May 2, 2001 (JP) ............................ 2001-135322
Sep. 11, 2001 (JP) ............................ 2001-275089
Oct. 1, 2001 (JP) ............................ 2001-305566

(51) Int. Cl.
*H01L 23/48* (2006.01)

(52) U.S. Cl. ...................... 257/773; 257/734; 257/746; 977/762; 977/765; 977/766

(58) Field of Classification Search ................. 257/25, 257/23, 24, 27, 777, 734, 746, 773; 977/762, 977/765, 766
See application file for complete search history.

(56) References Cited

U.S. PATENT DOCUMENTS

| | | | |
|---|---|---|---|
| 6,040,248 A * | 3/2000 | Chen et al. .................. | 438/725 |
| 6,297,063 B1 | 10/2001 | Brown et al. .................. | 438/2 |
| 6,314,019 B1 * | 11/2001 | Kuekes et al. .............. | 365/151 |
| 6,340,822 B1 * | 1/2002 | Brown et al. .................. | 257/25 |
| 6,465,813 B1 * | 10/2002 | Ihm ............................ | 257/183 |
| 6,515,339 B1 | 2/2003 | Shin et al. .................. | 257/368 |
| 6,566,704 B1 * | 5/2003 | Choi et al. .................. | 257/314 |

(Continued)

FOREIGN PATENT DOCUMENTS

JP 7-122198 5/1995

(Continued)

OTHER PUBLICATIONS

Kreupl et al., Carbon nanotubes in interconnect applications, *Microelectronic Engineering*, 64 (Oct. 2002) 399.*

(Continued)

*Primary Examiner*—Bradley K. Smith
*Assistant Examiner*—Douglas Menz
(74) *Attorney, Agent, or Firm*—Staas & Halsey LLP

(57) ABSTRACT

An integrated circuit device having vias having good resistance to migration causing the breaking of a wiring line, or an integrated circuit device having a wiring structure that is fined by breaking the limit of lithography technique is provided. The former device comprises a plurality of elements fabricated on a semiconductor substrate, wiring lines for making the elements and the integrated circuit device function, and vias for interconnecting wiring lines in separate layers, the via being formed of one or more cylindrical structures made up of carbon atoms. The latter device comprises a plurality of elements fabricated on a semiconductor substrate and wiring members for making the elements and the integrated circuit device function, at least part of the wiring members being formed of one or more cylindrical structures made up of carbon atoms. The latter device is preferably manufactured by a method comprising using a CVD process for the formation of the cylindrical structures, while applying a direct current electric field so as to grow the cylindrical structures in one direction, or applying an alternating current electric field so as to grow the cylindrical structures in two directions. A semiconductor device using a carbon nanotube and a method of forming a pattern using a carbon nanotube as a mask are also disclosed.

82 Claims, 36 Drawing Sheets

U.S. PATENT DOCUMENTS

| | | | |
|---|---|---|---|
| 2001/0023986 A1* | 9/2001 | Mancevski | 257/741 |
| 2002/0158342 A1* | 10/2002 | Tuominen et al. | 257/784 |
| 2002/0167375 A1* | 11/2002 | Hoppe et al. | 333/186 |
| 2003/0179559 A1 | 9/2003 | Engelhardt et al. | 361/780 |

FOREIGN PATENT DOCUMENTS

| | | |
|---|---|---|
| JP | 11-274470 A | 10/1999 |
| JP | 2002-1182468 A | 4/2002 |
| JP | 2003-17508 A | 1/2003 |
| JP | 2003-523608 | 8/2003 |

OTHER PUBLICATIONS

Li et al., Bottom-up approach for carbon nanotube interconnects, *Appl. Phys. Lett.,* 82 (Apr. 2003) 2491.*

Nihei et al., Simultaneous formation of multiwall carbon nanotubes and their end-bonded ohmic contacts to Ti electrodes for future ULSI interconnects, *Japan. J. Appl. Phys.,* 43 (Apr. 2004) 1856.*

Japanese Office Action corresponding to Japanese Patent Application No. 2001-305566 dated Aug. 30, 2005.

* cited by examiner

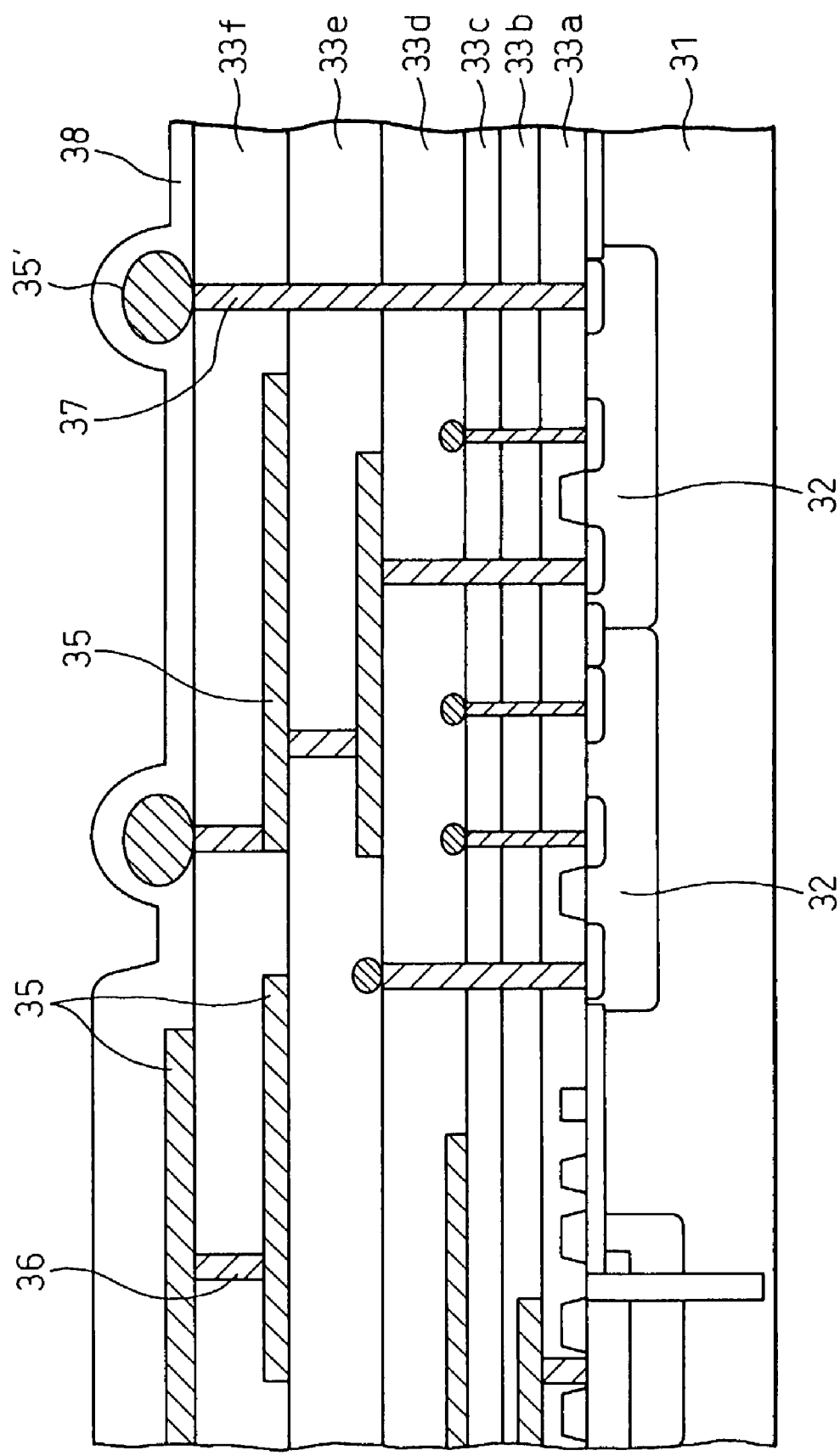

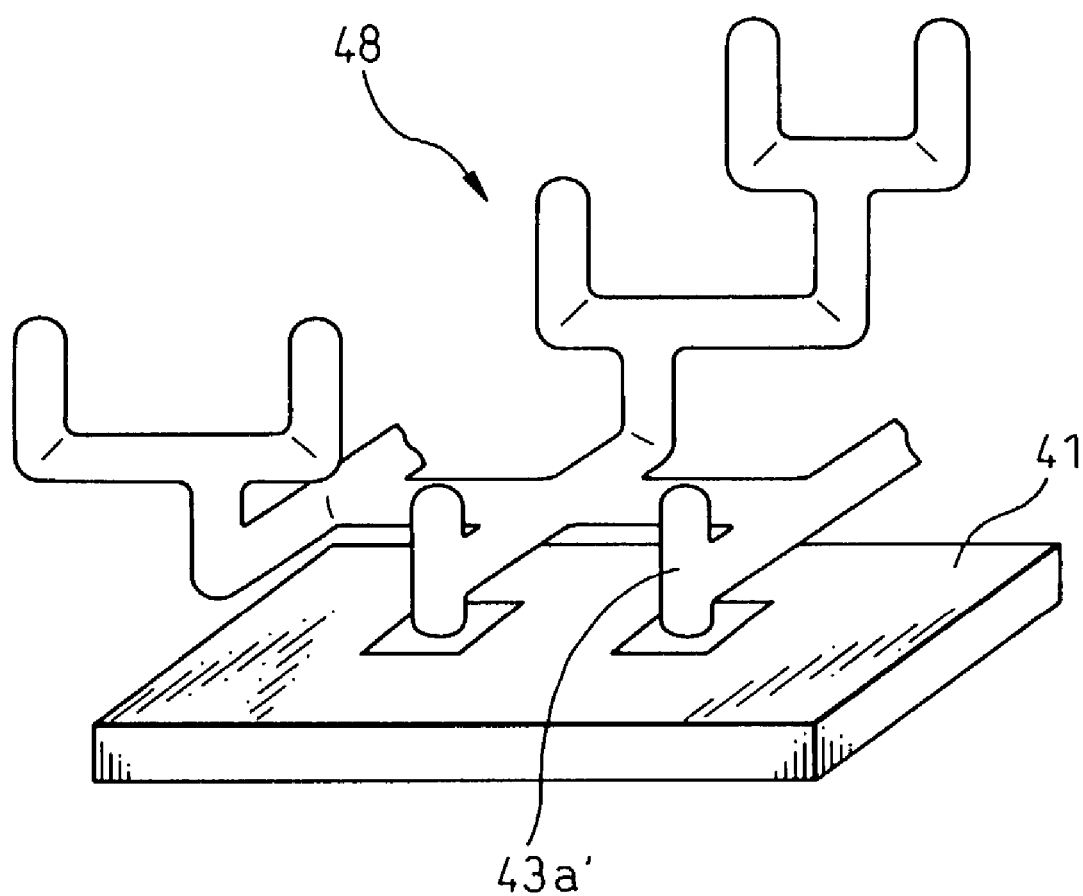

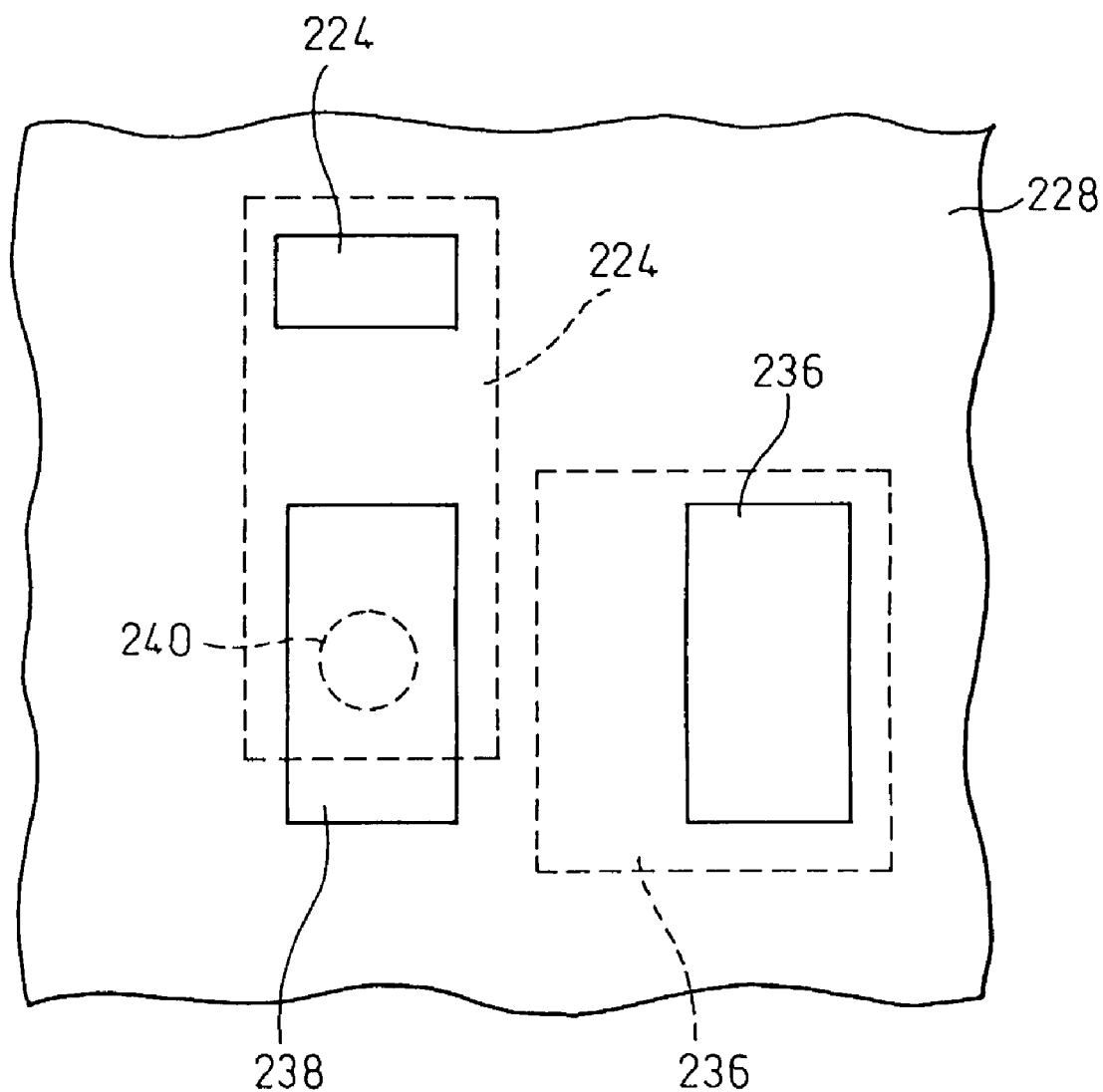

INTEGRATED CIRCUIT DEVICE AND METHOD OF PRODUCING THE SAME

BACKGROUND OF THE INVENTION

1. Field of the Invention

The invention relates to an integrated circuit device and, more particularly, to an integrated circuit device in which a cylindrical structure made up of carbon atoms is used as a material for a wiring member or a material for a via interconnecting wiring lines located in separate layers.

Also, the present invention relates to a semiconductor device, and in particular to a semiconductor device of a new type made up of a cylindrical multilayer structure or, typically, a new material called carbon nanotube.

Further, the present invention relates to a transistor, and in particular to a field effect transistor made of carbon nanotubes having metallic characteristics used as a gate material.

Furthermore, the present invention relates to a method of forming a micro pattern using carbon nanotubes as a masking material for dry etching.

2. Description of the Related Art

A half of a century has passed since the invention of the transistor, and remarkable progress has been made in semiconductor integrated circuits (semiconductor ICs) developed based on transistor technology, leading to large scale integrated circuits (LSIs) having ever greater integrity. With a current LSI, a phenomenon of movement of a metal atom of a wiring material, which is known as a migration phenomenon, is noted as a factor in loss of reliability of the LSI. This phenomenon can result in the breaking of a wiring line caused by stresses on the wiring metal material or electrons passing through the wiring line, and, in most cases, occurs particularly at a via for interconnecting wiring lines which must take a complex structure. The migration caused by stress is called stress migration, and that caused by electrons passing through a wiring is called electro-migration.

As a wiring material, copper (Cu) has recently started to be used in place of conventional aluminum (Al). Although the use of copper improves the migration resistance of a wiring to some extent, it is said that the migration resistance of a wiring line of copper, represented by a current density, is at most of the order of up to $10^5$ amperes per square centimeter. This critical value for the migration resistance has intimate relation to the capacity of heat dissipation of a wiring line, and it is known that the critical value is lowered in the case of poor heat dissipation or increased temperature.

On the other hand, providing semiconductor ICs having increased performance has been done according to the scaling rule of transistors. This approach would reach its limit sooner or later due to factors such as a limit of lithography technique. As a method for overcoming the limit of lithography technique, there is a technique of forming a fine structure using self-organizing. Currently, quantum dot devices and molecular devices using self-organizing, which are generally termed nano-devices, are energetically studied and, to enter an era in which such nano-devices are used as components in integrated circuits, wiring techniques for these devices must also be developed in parallel. Otherwise, the integrity of the nano-device is also forced to be determined by the limit of wiring technique.

On the other hand, since the invention of the transistor, it has progressed with various improvements. Taking as an example, the field effect transistor in which the channel region located between two regions including the source and the drain is formed as a current path of carriers and the electrical resistance of this channel is changed by the voltage of the gate electrode thereby to control the current flowing in the channel region, to meet the requirement of operation at higher speed and higher frequency, the gate length has been reduced and the carrier mobility of the channel material has increased greatly. The gate length has already been reduced to the order of 10 nm, which has posed many problems including the deteriorated matching accuracy due to fluctuations in lithography, an increased turn-off current of the transistor (short channel effect), a turn-on current saturation and an increased gate leakage current. Achieving a high dielectric constant of the gate insulating film has been studied as reliable means for solving some of these problems. On the other hand, an approach to improved current controlability of the gate has been conceived of by changing the gate structure of the transistor from the planar type currently employed to the three-dimensional type (e.g., what is called the surround gate structure).

In the surround gate structure, as shown in FIG. 9, a semiconductor channel layer (a p-type semiconductor layer in the case under consideration) 301 is surrounded by a gate electrode 302 like a coaxial cable. In this structure, the electric lines of force extending from the gate are prevented from escaping out of the channel, and therefore the current control efficiency is higher than that of the gate structure of planar type, thereby making a promising candidate for suppressing the short channel effect. In the semiconductor device shown in FIG. 9, reference numeral 303 designates a source electrode, numeral 304 a drain electrode, numeral 305 a high-concentration n-type semiconductor layer buried in a semiconductor substrate 309 for connecting the source electrode 303 and the channel 301, numeral 306 a high-concentration n-type semiconductor layer for connecting the drain electrode 304 and the channel 301, and numeral 307 an insulating material.

Nevertheless, the surround gate structure requires a cylindrical semiconductor layer extending upward of the substrate surface, which cannot be easily fabricated. For this reason, many problems still remain to be solved. For example, the threshold voltage (the gate voltage for turning off the current flowing in the transistor) is liable to vary from one transistor to another, and the control of impurities concentration by doping is difficult.

The various problems including the aforementioned ones are inherent to the conventional field effect transistors, or especially, those extremely micronized, and are a stumbling block to the development of a field effect transistor having superior characteristics which have yet to be realized.

Higher density of the semiconductor LSI has been promoted by the micro-fabrication technique of component semiconductor elements and wires. In the micro-fabrication of the semiconductor LSI, the first step is to etch a substrate using a resist patterned by lithography as a mask. A high resolution and a high etching durability are the characteristics required of the resist. In the conventional organic polymer resist, however, a pattern of the order of 10 nm, which is smaller than the polymer molecule, cannot be resolved. Also, insufficient resistance of the resist to dry etching makes it necessary to transfer the pattern to another film for etching.

The shortest gate length of the transistor so far reported is 8 nm for a transistor having a MOS structure fabricated by electron beam exposure. Since the resolution of the resist has almost reached a limit, however, the gate formed by this method has large gate size fluctuations and inferior linearity. This gate, therefore, is not suitable for practical applications. Generally, the reduction of gate length contributes most effectively to an improved high-speed and high-frequency performance of the transistor. Therefore, a technique for matching the gate to 10 nm or less with minimum fluctuations which replaces the use of resist is in great demand.

A HEMT (high electron mobility transistor) fabricated on an InP substrate is currently known as a high-frequency transistor of the highest performance. The HEMT of the highest performance reported by A. Endoh, et al. has a gate length of 25 nm with a cut-off frequency $f_T$ as high as about 400 GHz (A. Endoh et al., IPRM '01, pp.448–451 (2001)). with regard to the high-speed optical communication network, on the other hand, the TDM system having a communication speed of 40 Gbps is under development. As a future system, however, a communication speed of 160 Gbps is desired (FIG. 23). In such a case, the frequency $f_T$ four to five times as high as the communication speed is generally required as the characteristics of the electronic devices for communication of an optical modulation system. For the communication speed of 160 Gbps, for example, it is predicted that the frequency $f_T$ of 640 to 800 GHz is required. A certain correlationship is known between the frequency $f_T$ and the gate length of an electronic device, and is plotted as a graph in FIG. 24. In FIG. 24, the relation between the gate length so far realized and the corresponding frequency $f_T$ (the range indicated by solid line in FIG. 24) is extrapolated. It is thus seen that a gate length of less than 10 nm is required for obtaining the frequency $f_T$ of about 800 GHz. In this way, further reduction of the gate length is essential to meet the requirement of high-speed communication in the foreseeable future.

SUMMARY OF THE INVENTION

An object of the invention is to provide an integrated circuit device provided with vias having good resistance to migration causing the breaking of a wiring line, and having improved reliability.

Another object of the invention is to provide an integrated circuit device provided with a wiring structure that is fined by breaking the limit of lithography technique.

Still another object of the invention is to provide a semiconductor device of quite novel type, and in particular to a semiconductor device in which the short channel effect can be effectively suppressed, while making possible the high-speed and the high-frequency operation with a high current driving ability.

Yet another object of the invention is to provide a field effect transistor having a micro gate which is free of dimensional fluctuations to meet the demand for a gate reduced in size more than before.

A further object of the invention is to provide a method of forming a micro pattern whereby a micro structure including such a micro gate can be formed.

According to the invention, there is provided an integrated circuit device which is provided with vias having good migration resistance, the integrated circuit device comprising a plurality of elements fabricated on a semiconductor substrate, wiring lines for making the elements and the integrated circuit device function, and vias for interconnecting wiring lines in separate layers, wherein the via is formed of one or more cylindrical structures made up of carbon atoms.

There is also provided an integrated circuit device which is provided with a wiring structure that is fined by breaking the limit of lithography techniques, the integrated circuit device comprising a plurality of elements fabricated on a semiconductor substrate and wiring members for making the elements and the integrated circuit device function, wherein at least part of the wiring members are formed of one or more cylindrical structures made up of carbon atoms.

According to another aspect of the invention, there is provided a semiconductor device comprising a cylindrical multilayer structure configured of carbon elements, including an inner cylindrical member having semiconductor-like characteristics and an outer cylindrical member having metallic characteristics, in which the electric conductivity of the inner cylindrical member of the multilayer structure is controlled by the voltage applied to the outer cylindrical member.

More specifically, the semiconductor device according to the invention comprises a cylindrical multilayer structure configured of carbon elements including an inner cylindrical member having semiconductor-like characteristics and an outer cylindrical member having metallic characteristics, a pair of conductors arranged in opposed relation to each other with the outer cylindrical member in-between and connected to the opposed sides of the inner cylindrical member, respectively, and means for applying a voltage to the outer cylindrical member.

The basic configuration of the semiconductor device according to this invention is described above, and may take various forms as described in detail below.

According to still another aspect of the invention, there is provided a field effect transistor using a metallic carbon nanotube as a material for realizing a micro gate. Specifically, the field effect transistor according to the invention comprises a source for supplying carriers, i.e. electrons or holes contributing to electric conductivity in a semiconductor device such as a transistor, a drain for receiving the carriers, and a gate constituting a current control electrode for controlling the current flowing through a channel forming a current path between the source and the drain, by changing the conductivity of the channel, wherein the gate is formed of a metallic carbon nanotube.

According to yet another aspect of the invention, there is provided a method for forming a micro pattern free of dimensional variations by using the carbon nanotube as a mask for etching. Specifically, in the method of forming a micro pattern according to the invention, a carbon nanotube is arranged on a substrate, and using this carbon nanotube as a mask, the dry etching is carried out, so that the shape of the carbon nanotube is transferred to the substrate thereby to pattern the substrate.

BRIEF DESCRIPTION OF THE DRAWINGS

The above and other objects and advantages of the invention will be well understood and appreciated by skilled persons in the art, from consideration of the following detailed description made by referring to the attached drawings, wherein:

FIG. 6 is a schematic perspective view illustrating a three-dimensionally branched wiring structure, FIG. 22 is a plan view of a semiconductor device fabricated through the process shown in FIGS. 18 to 21.

DETAILED DESCRIPTION OF THE INVENTION

In the invention, a cylindrical structure made up of carbon atoms, which is a nano-structure based on self-organizing, is used as a material for wiring lines or vias in an integrated circuit device. Such nano-structures include a nano-structure generally known as a carbon nanotube.

Carbon nanotube is a new carbon-based material, to which attention has recently been paid because of its unique properties. Carbon nanotube has a structure of a cylindrically rolled graphite sheet in which carbon atoms are arranged in the form of united six-membered rings through the strongest bond of sp2, the end of the tube being closed by several six-membered rings accompanied with five-membered rings. Carbon nanotube can have a fined diameter of down to the order of sub-nanometer, with the minimum diameter being 0.4 nanometer. The physical properties of this material are only now being studied, and it is known that the material has a coefficient of thermal conductivity greater than that of diamond, a current density of approximately more than $10^8$ amperes per square centimeter, and a high Young's modulus.

For the formation of carbon nanotube, arc discharge or laser ablation are conventionally used. Recent study reports show that it is also possible to form carbon nanotube by a plasma or thermal CVD process. Although the method using arc discharge or laser ablation makes it possible to produce nanotubes having a high quality, it is not suitable for the production of integrated circuits. On the other hand, the method using a CVD process has feasibility for application to the production of integrated circuits.

The integrated circuit device according to the invention, which is provided with vias having good migration resistance, is characterized by using carbon nanotube as a via material. The carbon nanotube is preferably formed by a CVD process.

Figure 1:
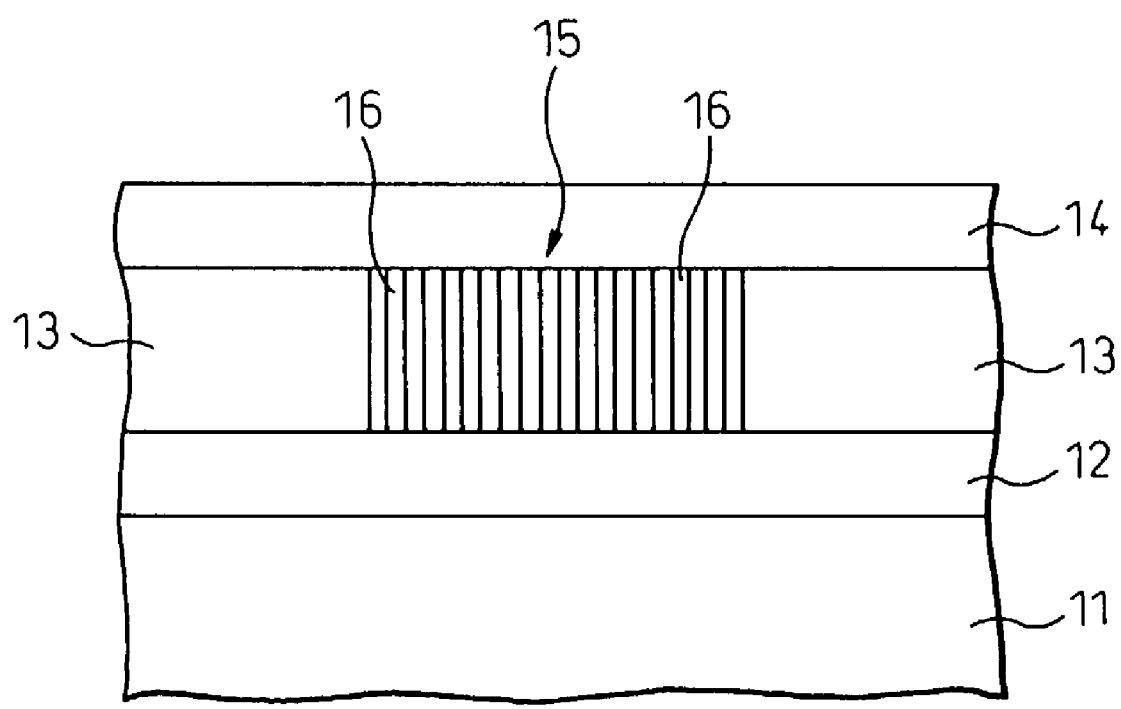
FIG. 1 is an illustration showing an embodiment of the integrated circuit device of the invention provided with vias having good resistance to migration.

An embodiment of the integrated circuit device of the invention provided with vias having good migration resistance will now be illustrated making reference to FIG. 1, which shows the portion including a via in an integrated circuit device. In the device of this drawing, an underlying layer 11 is surmounted successively with a lower wiring layer 12, an insulation layer 13, and an upper wiring layer 14, the lower wiring layer 12 and the upper wiring layer 14 being interconnected by a via 15 piercing through the insulation layer 13 interposed therebetween. The via 15 is formed of a set of individual carbon nanotubes 16. The underlying layer 11 is commonly an insulation layer, and is located on a semiconductor substrate (not shown) or another wiring layer (not shown). The lower and upper wiring layer 12, 14 may be formed of any electrically conductive material, for example, a metal material such as copper or aluminum, or a laminate material comprising a layer of such a metal. The insulation layer 13 (also called an interlayer insulation layer) may be formed of a film of a silicon-based insulation material, which is commonly used at present, or of a film of a porous material or the like having a lower dielectric constant. In some cases, a so-called aerial wiring structure, in which the insulation layer 13 is eliminated, may be used.

Referring to FIG. 2, a method of forming vias shown in FIG. 1 is illustrated. As shown in FIG. 2A, on the lower wiring layer 12 provided on the underlying layer 11, the insulation layer 13 provided with an opening 17 having a pattern corresponding to the shape of a via to be formed is formed. In the drawing, a resist pattern for the formation of the patterned opening 17 is indicated by 13b. Subsequently, as shown in FIG. 2B, a catalyst 18 is deposited on the top face of the lower wiring layer 12 exposed at the bottom of the opening 17. As the catalyst 18, cobalt, nickel, iron or the like can be used. The deposition of the catalyst 18 can be carried out by a technique such as sputtering or evaporation, followed by lift-off of the resist pattern 13b. As shown in FIG. 2C, a via 15 consisting of a bundle of carbon nanotubes is grown within the opening 17 using the catalyst 18 by a plasma CVD or thermal CVD process. It is known that plasma CVD and thermal CVD are different from each other in growth mechanism. After the growth of carbon nanotubes, the catalyst 18 is left at the grown end of the nanotubes in the case of the plasma CVD, and is left at the root of the nanotubes (i.e., is left as it was at the bottom of the opening 17 as shown in FIG. 17B) in the case of thermal CVD. The via 15 shown in FIG. 2C represents one grown by plasma CVD. The upper wiring line 14 is then formed, the layer 14 being connected to the lower wiring layer 12 through the via 15, as shown in FIG. 2D. The lower and upper wiring layers 12, 14 and the insulation layer 13 may be formed by any known method in the art.

Figure 2A:
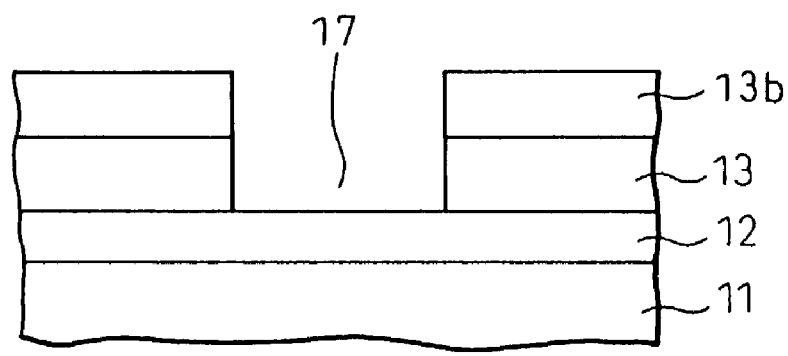
FIGS. 2A to 2D show the formation of the via in the integrated circuit device of FIG. 1, FIG. 3 schematically shows a carbon nanotube containing fullerenes having a metal incorporated therein, FIG. 4 schematically shows an integrated circuit device of the invention comprising wiring members formed of carbon nanotubes.
Figure 2B:
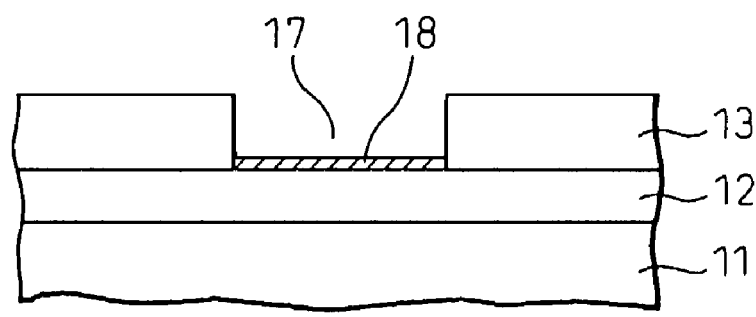
Figure 2C:
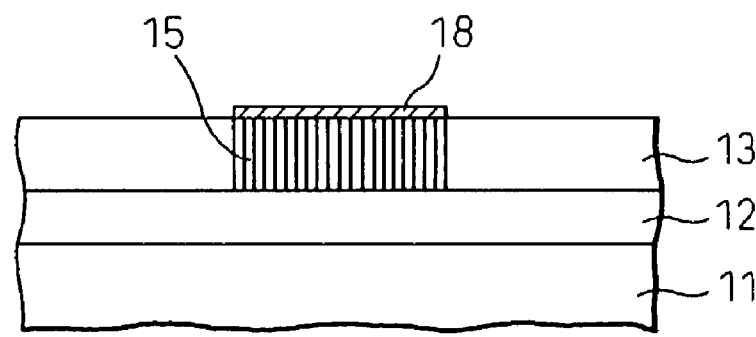
Figure 2D:
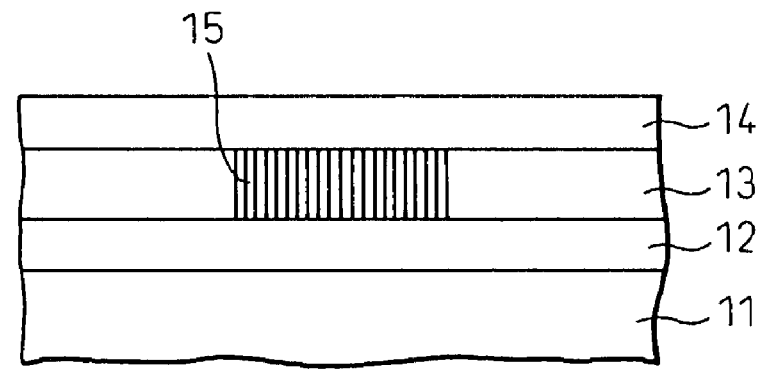

The catalyst 18 at the grown end of the via 15 shown in FIG. 2C may be removed prior to the formation of the upper wiring layer 14, or may be left as it is without removal thereof. In practice, the catalyst 18 at the grown end of the via 15 is located within each nanotube closed at its end by several six-membered rings of carbon atoms accompanied with five-membered rings. When the catalyst 15 is to be removed, a method such as one in which the portion of the five-membered ring, which has a weaker bond compared to the six-membered ring, is broken by oxygen plasma ashing or the like can be used.

It is known that a carbon nanotube may have a single layer structure or a multilayer structure. A nanotube of a single layer structure type is formed of one cylinder (one cylindrically rolled graphite sheet), and a nanotube of a multilayer structure type is formed of a plurality of cylinders, which have different diameters and arranged sequentially from the outermost to the innermost of the nanotube structure.

Thus, the via in the integrated circuit device of the invention may be formed of one or more cylindrical structures made up of carbon atoms, such as carbon nanotubes, the cylindrical structure being constructed of a single cylindrical body, such as a tube-like body, or a plurality of cylindrical bodies having different sizes and arranged coaxially. Such a cylindrical structure, typically a carbon nanotube, used for the via of the integrated circuit device of the invention may be constructed of either a single cylindrical body or a plurality of coaxially arranged cylindrical bodies. Also, the via may include only one type of cylindrical structure constructed of a single cylindrical body and a plurality of cylindrical bodies, or a combination of both types of cylindrical structures.

In addition, the via in the integrated circuit device of the invention may be formed of one carbon nanotube, or a set of a plurality of nanotubes as referred to above.

Figure 3:
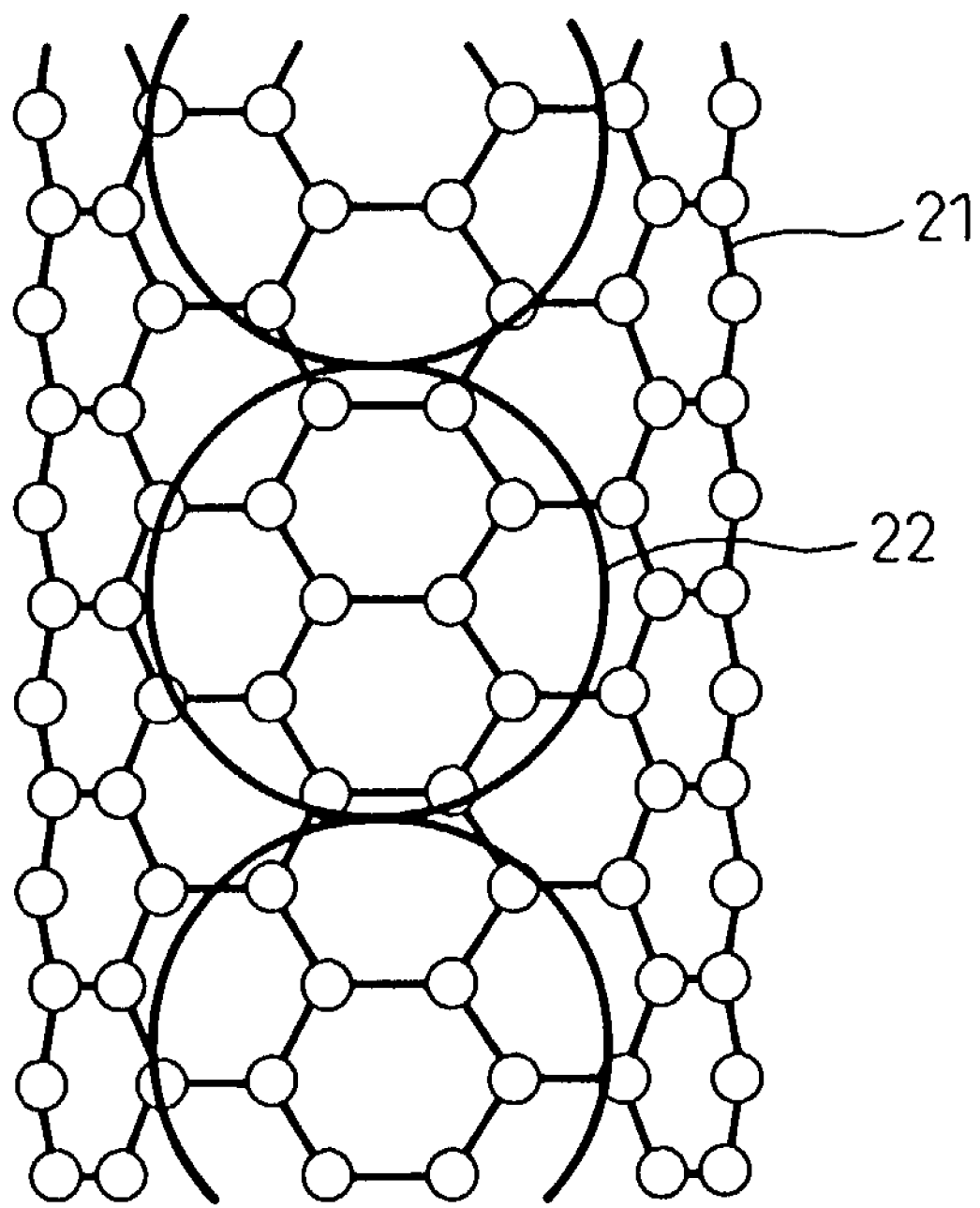

The via in the integrated circuit device of the invention may be formed using a nanotube having a so-called pea-pod structure, in which a carbon nanotube is filled with nano-structures different therefrom, which exhibits metallic properties as a whole, such as a fullerene having a metal incorporated therein. FIG. 3 schematically shows a carbon nanotube 21 containing metal-incorporating fullerenes 22. Although a fullerene has a polyhedron structure consisting of five- and six-membered rings of carbon atoms, it is depicted in the form of a sphere in the drawing, for simplification. A metal incorporated in the fullerene 22 is not shown also for simplification. In addition, a carbon nanotube filled with a rod of metal, such as copper may be used, in place of fullerenes.

By using such a nanotube of pea-pod structure containing nano-structures different from the nanotube, it is possible to enhance the electrically conductive properties and the mechanical strength of a via. For example, in the case of a carbon nanotube containing metal-incorporating fullerene, it is known, from a first principle calculation, that the electrical charge of the incorporated metal appears at the outside of the fullerene, and further appears at the outside of the nanotube. In this case, the via accordingly has improved electrically conductive properties.

A nano-structure different from a carbon nanotube and exhibiting metallic properties as a whole, such as a metal-incorporating fullerene, or a molecule or atom also having such properties, may not be present in a nanotube, but be present between neighboring nanotubes forming a via. Also, it is possible to position such a nano-structure different from a carbon nanotube, or a molecule or atom having metallic properties, between neighboring nanotubes containing metal-incorporating fullerenes.

As a method of positioning metal-incorporating fullerenes in a carbon nanotube or between neighboring nanotubes, a method in which carbon nanotubes are exposed to an atmosphere containing metal-incorporating fullerenes can be referred to. The metal-incorporating fullerenes are sucked by a strong suction force which the carbon nanotube exhibits, to be positioned in place. In the case where fullerenes are to be positioned in a nanotube, it is necessary to open the end of the nanotube in advance by oxygen plasma ashing or the like.

The via of the integrated circuit device of the invention, which is made up of one or more carbon nanotubes, is characterized in that, among other things, (1) it has a high resistance to stress migration because a carbon nanotube has greater strength as a structure than that of a material currently used for a via, (2) it also has high resistance to electro-migration because a carbon nanotube has a strong bond between carbon atoms and low mobility of the atoms, (3) it has high heat dissipation efficiency because a carbon nanotube has the highest coefficient of thermal conductivity among existent materials, which is also useful as a measure against migration, (4) it allows a high-density current to pass therethrough, and (5) it may have a reduced sectional area because a carbon nanotube has a structure determined in a self-organizing manner.

The integrated circuit device according to the invention, which is provided with a wiring structure that is fined by breaking the limit of lithography techniques, is characterized by using wiring members formed of one or more cylindrical structures made up of carbon atoms. In this integrated circuit device, the carbon nanotube can also be preferably formed by a CVD process. The "wiring member" in the integrated circuit device includes wiring lines in a wiring layer formed on an insulation layer, vias piercing through an insulation layer and interconnecting wiring lines in wiring layers located on both sides of the insulation layer, and contacts connecting to a wiring line for interconnecting elements in the integrated circuit device. Part of the wiring members included in the integrated circuit device, such as wiring lines for connecting the integrated circuit device to an external circuit, may be formed of a conductive material other than carbon nanotube, such as a metal.

FIG. 4 schematically shows an integrated circuit device comprising wiring members formed of carbon nanotubes of a cylindrical structure made up of carbon atoms. In the device, elements, such as transistors 32, are fabricated in a silicon substrate 31, and a plurality of insulation layers (interlayer insulation layers) 33a–33f are formed over the elements. Wiring layers are located on both sides of an insulation layer, and a wiring line 35 in a certain wiring layer is connected to a wiring line 35 in another wiring layer through a via 36 piercing through the insulation layer. A contact connecting a wiring line 35' for interconnecting elements in the integrated circuit device is indicated by numeral 37. In the integrated circuit device shown in the drawing, all of wiring lines 35, 35', vias 36, and contacts 37 are formed of carbon nanotube. The top wiring layer is covered by a protective layer 38.

Referring to FIG. 5, the formation of carbon nanotube wiring members by a CVD process is illustrated. As described above, plasma CVD and thermal CVD are different from each other in growth mechanism, and at the end of the growth of carbon nanotubes, a catalyst used for the growth of the nanotubes is left at the grown end of the nanotubes in the case of plasma CVD, and is left at the root of the nanotubes in the case of thermal CVD. In the case illustrated in FIG. 5, carbon nanotubes are grown by plasma CVD and, accordingly, a catalyst is located at the end of a grown nanotube throughout the course of growth. In FIG. 5, however, the catalyst is not shown, for simplification. Also, in FIG. 5, carbon nanotubes are depicted in the form of a cylinder or a column, for simplification.

Figure 5A:
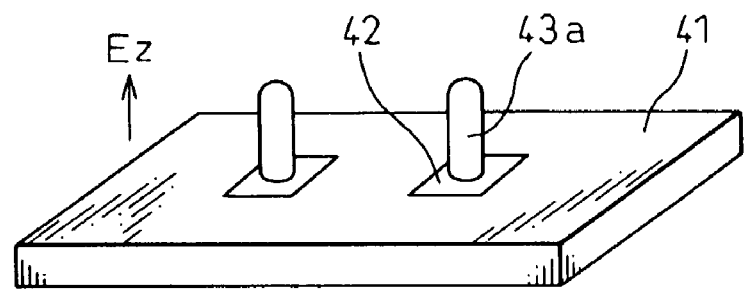
FIGS. 5A to 5D show the formation of carbon nanotube wiring members by a CVD process.

As shown in FIG. 5A, carbon nanotubes 43a are grown vertically and upward from electrode pads 42 provided on the top face of a substrate 41, by a plasma CVD process. A metal catalyst needed for the growth of the nanotube is positioned in advance at a predetermined location on the electrode pad 42.

It is known that to grow a carbon nanotube vertically from the face of a substrate by a CVD process, it is important that an electric field is present in the direction perpendicular to the face of the substrate. Thus, when the carbon nanotubes 43a are grown vertically and upward from the electrode pads 42, as shown in FIG. 5a, an electric field Ez is applied in the vertical direction, as shown in the drawing.

Figure 5B:
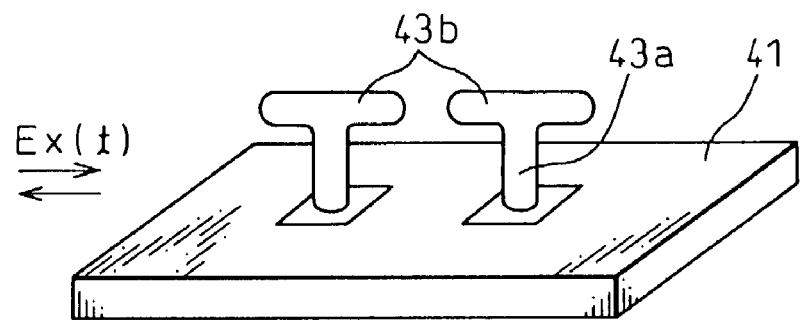

The carbon nanotube 43a is then opened at its grown end containing and covering the metal catalyst by oxygen plasma ashing, to thereby expose the catalyst metal, after which plasma CVD is continued to growth carbon nanotubes 43b while applying an electric field Ex(t) in the horizontal direction, as shown in FIG. 5B. In contrast to the electric field Ez applied in the step at FIG. 5A, which is a direct current electric field since the nanotubes 43a are grown in one direction, i.e., vertically and upward, the electric filed Ex(t) applied in the step of FIG. 5B is a alternating current electric field. As a result, in the step of FIG. 5B, the carbon nanotubes 43b are grown horizontally in two opposed directions starting from the end of the vertically grown nanotube 43a, at which the metal catalyst is exposed by the oxygen plasma ashing. The metal catalyst exposed prior to the application of the AC electric field is divided into two after the application of the AC electric field, each of which moves together with the grown end of the nanotube 43b in one of the two opposed directions. Although the grown nanotube illustrated in FIG. 5B is in the shape of a T as a whole because of the AC electric field applied parallel to the substrate 41, the shape of the grown nanotube is not limited only to the shape of a T. For example, by appropriate control of an applied electric field, such as by use of direction of an applied AC electric field other than horizontal, or application of an offset DC electric field. any possible three-dimensional an shape of carbon nanotube, such as Y- or ↑-shape, may be formed. Also, by the application of a horizontal DC electric field, a carbon nanotube in the form of a reversed L-shape can be formed.

The wiring member in the integrated circuit device of the invention may be formed of a single carbon nanotube or a set of a plurality of nanotubes. The carbon nanotube may have a single-layer structure or a multilayer structure. When a wiring member is formed of a plurality of nanotubes, the wiring member may be comprised of a combination of nanotubes having a single-layer structure and a multilayer structure, or only nanotubes having either a single-layer structure or a multilayer structure.

Figure 5C:
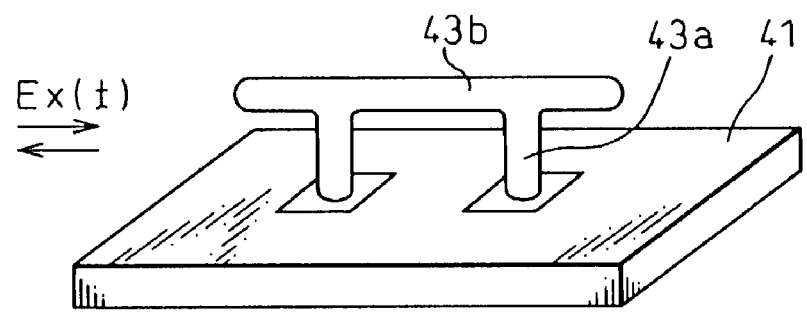
Figure 5D:
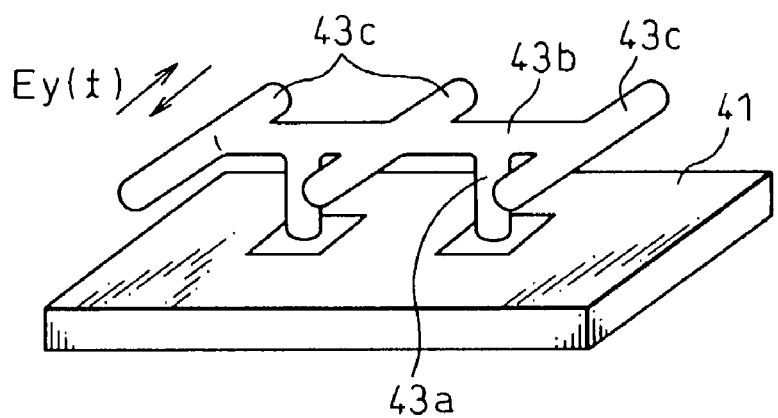

When the growth of carbon nanotubes in the horizontally opposed two directions is continued, the ends of the carbon nanotubes 43b grown from the ends of neighboring vertically grown nanotubes 43a so as to go near to each other may come into contact, as shown in FIG. 5C. At this point, if an AC electric field Ey(t) having an application direction perpendicular to the applying direction of the AC electric field Ex(t), as shown in FIG. 5D, carbon nanotubes 43c then start growing in the direction perpendicular to the growing direction of the previously grown carbon nanotubes 43b, in the same plane.

By repeating the vertical and horizontal growing steps described above, a three-dimensionally branched wiring structure can be readily formed. FIG. 6 illustrates a three-dimensionally branched wiring structure 48 formed on a substrate 41 by so repeatedly changing the directions of the applied electric field.

Such a three-dimensionally branched wiring structure may be formed not only by the plasma CVD process as earlier described but also a thermal CVD process, or by the use of a combination of a plasma CVD process and a thermal CVD process. For example, the three-dimensionally branched wiring structure 48 shown in FIG. 6 can be obtained by first forming vertical carbon nanotubes 43a' on the substrate 41 by a plasma CVD process while applying a vertical electric field, and then switching from the plasma CVD process to a thermal CVD process and continuing the growth of nanotubes by the thermal CVD process while alternately applying a horizontal AC electric field and a vertical DC electric field. In this case, a metal catalyst (not shown) for the growth of nanotube is left at the grown end of the nanotube 41a' formed by the first plasma CVD process.

As described, in the invention, a plasma or thermal CVD process is used for both the formation of vias having good resistance to migration and the construction of a wiring structure that is fined beyond the limit of lithography techniques. Although such a CVD technique is well known, and no explanation thereof is needed herein, reference can be made to a plasma CVD process carried out by feeding methane ($CH_4$) and hydrogen ($H_2$) gases at about 400 to 650° C. and under an applied electric field and vacuum, and a thermal CVD process carried out by feeding acetylene ($C_2H_2$) and hydrogen gases also at about 400 to 650° C. under an applied electric field and vacuum, by way of example. In both cases, a metal, such as cobalt, iron, or nickel, is used as a catalyst.

In FIGS. 5 and 6, no insulation layers are shown. Such a wiring structure having no insulation layer, which represents a so-called aerial wiring structure, has been proposed as an ultimate means for lowering the dielectric constant of an interlayer insulation film. Carbon nanotube has very high mechanical strength, so that the integrated circuit device of the invention using carbon nanotube as a material for wiring members is suited to have an aerial wiring structure in which the wiring members are not surrounded with an insulation layer and are exposed. In the aerial wiring structure, it is preferred to use a multi-wall nanotube which is superior in mechanical strength. Nonetheless, the integrated circuit device of the invention using carbon nanotube as a material for wiring members can also have an interlayer insulation layer or layers, as illustrated in FIG. 4. The interlayer insulation layer can be formed of, for example, a film of a porous material having a low dielectric constant. According to the invention, an integrated circuit device in which part of wiring members are exposed and the remainder are embedded in an insulation material may be envisaged.

Figure 7A:
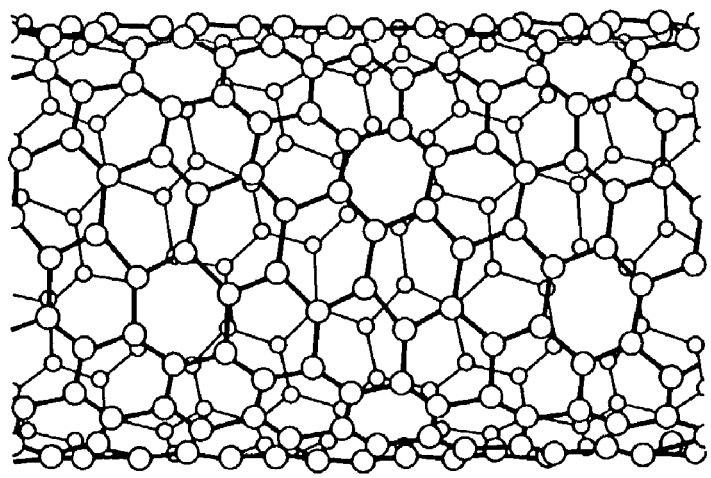
FIGS. 7A to 7C illustrates different chiralities of carbon nanotubes, FIG. 8 schematically shows a carbon nanotube having a metal-semiconductor junction.
Figure 7B:
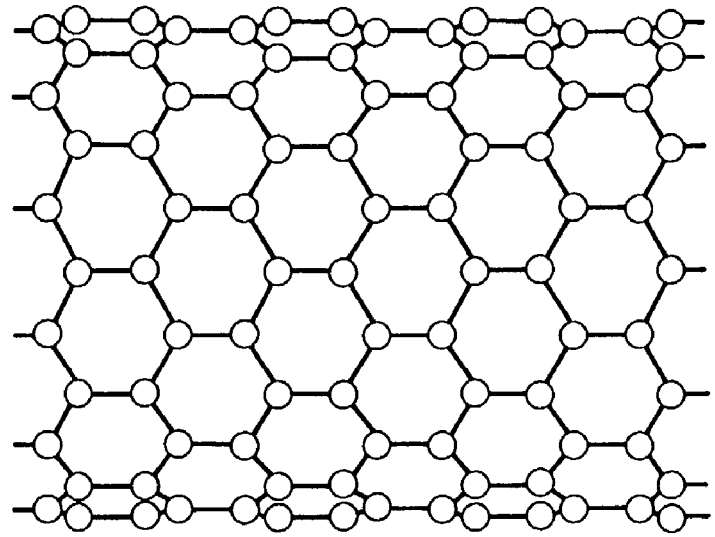
Figure 7C:
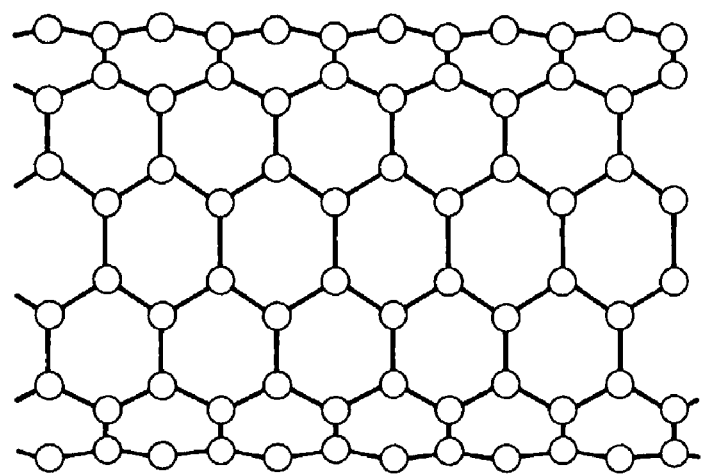

Carbon nanotube may have an energy band structure satisfying conditions for exhibiting metallic properties or an energy band structure satisfying conditions for exhibiting semiconductor-like (semimetallic) properties. The chirality of a carbon nanotube (the manner of rolling a graphite sheet forming the carbon nanotube) is concerned as to whether it exhibits metallic properties or semiconductor-like properties. FIG. 7A illustrates the chirality (also called an armchair type) of a carbon nanotube exhibiting metallic properties, and FIG. 7B illustrates the chirality (also called a zigzag type) exhibiting semiconductor-like properties. The structure illustrated in FIG. 7C, which is known as a chiral type, may exhibit metallic or semiconductor-like properties, depending on conditions. Chiralities of carbon nanotubes obtained by growth by a CVD process are dependent on the CVD process used, growing conditions and the like.

Figure 8:
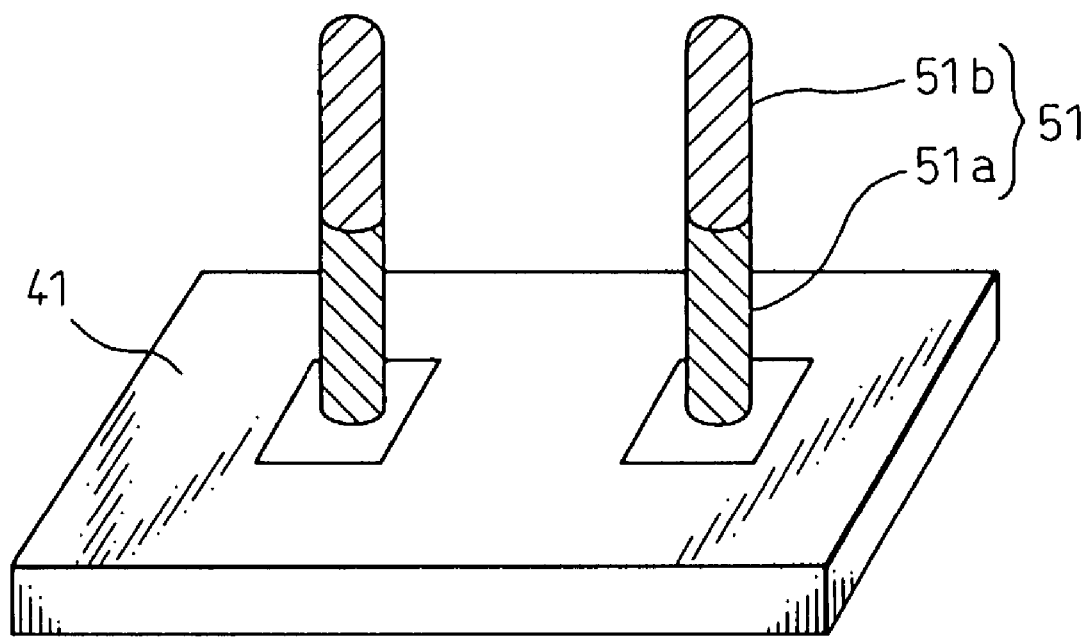

FIG. 8 illustrates vertical carbon nanotubes 51 consisting of part 51a initially grown by a plasma CVD process and part 51b subsequently grown by a thermal CVD process. Such a nanotube 51 has physical properties which are different in the vertical direction (or along the longitudinal axis), the difference in physical properties resulting from a hetero junction structure between the part 51a grown by plasma CVD and the part 5b grown by a thermal CVD process. As an example of the difference in physical properties, the difference in electrical conductivity between the two parts 51a and 51b resulting from the change in chirality from one to the other can be referred to. In addition, the difference in physical properties can be induced using, for example, the difference in the diameters of joined nanotubes, the difference in the numbers of cylinders forming joined nanotubes, the difference in the doping concentrations in joined nanotubes. In the example illustrated in FIG. 8, a metal-semiconductor junction having a rectifying effect may be formed, as a result of a succession of first growth of part 51a of metallic properties by a plasma CVD process and subsequent growth of part 5b of semiconductor-like properties by a thermal CVD process.

By incorporating such a metal-semiconductor junction structure in the middle of a wiring line, the wiring line becomes active, in contrast with a prior wiring line which is merely a component for transmitting a signal, and makes it possible to provide a functional, three-dimensional integrated circuit device. Of course, the metal-semiconductor junction structure may be provided at a via and, in some cases, even at a contact. An integrated circuit device in which part of vias have such a metal-semiconductor junction structure represents an preferred embodiment of the invention.

As described above, the invention makes possible the provision of a highly reliable integrated circuit device having improved resistance to migration in vias.

On the other hand, the invention makes possible the provision of an integrated circuit device having a wiring structure that is fined beyond the limit of lithography techniques and is formed of a nano-structure based on self-organizing suited to a nano-device so as to have three-dimensionally netted wiring lines.

In a semiconductor device according to the invention, a cylindrical structure configured of carbon elements making up a self-organized nano structure is used as a semiconductor material and a metal material of at least parts of the semiconductor device. Such a structure includes a material generally known as carbon nanotube. The cylindrical structure configured of carbon elements (hereinafter referred to as the carbon nanotube) usable for the semiconductor device according to the invention is a multilayer structure including an inner cylindrical member or tube having semiconductor-like characteristics and an outer cylindrical member or tube having metallic characteristics. The diameter of a tube can be micronized to the order of subnanometer and 0.4 nanometer as a minimum. Currently, a tube having a length of several 100 μm can be fabricated.

Each carbon nanotube, which has a structure formed by self-organization, normally has a constant diameter. A multinanotube with a tube incorporated in another tube can also be fabricated, each tube often having a different chirality. Taking advantage of this characteristic, a multilayer structure can be fabricated in which the inner tube has semiconductor-like characteristics and the outer tube has metallic characteristics.

The properties of this material are now being studied earnestly, and in addition to the aforementioned fact that the electrical conductivity is changed to the one of a semiconductor or the one of a metal depending on the chirality, the attractive properties thereof have already been reported. For example, a heat conductivity higher than that of diamond can be obtained, a current density more than $10^8$ ampere per $cm^2$ is possible, the Young's modulus is high, and a high occlusion efficiency for hydrogen or the like may be achieved.

This invention has the feature that the carbon nanotube is used for the channel and the gate of a micro transistor.

Figure 10:
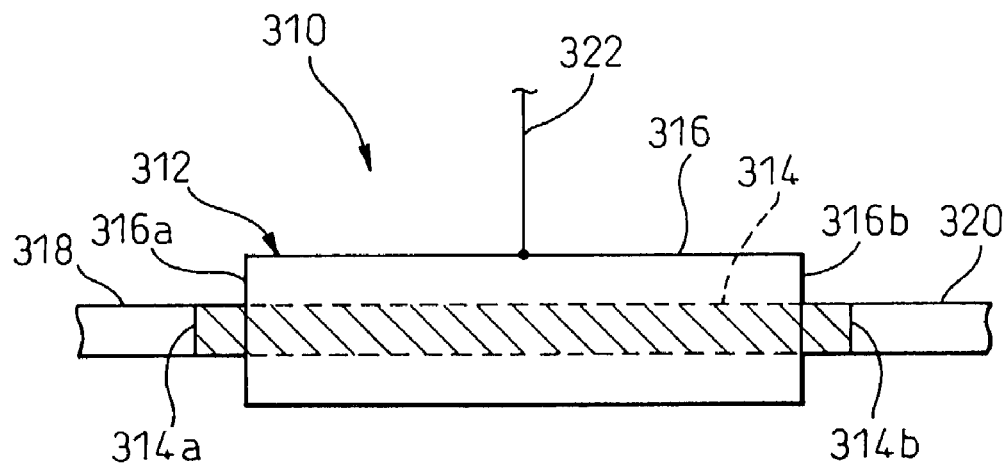
FIG. 10 illustrates a basic configuration of a semiconductor device according to the invention.

An embodiment of basic configuration is shown in FIG. 10. In FIG. 10, a semiconductor device 310 includes a multilayer structure 312 of carbon nanotube configured of an inner tube 314 and an outer tube 316. The inner tube 314 has semiconductor-like characteristics, and the outer tube 316 has metallic characteristics. The inner tube 314 and the outer tube 316 may each be configured of a multilayer structure having a plurality of tubes of the same characteristics (the semiconductor-like characteristics or the metallic characteristics). Each of the tubes is formed of a mesh structure of carbon elements as shown in FIG. 7. In FIG. 10 (and other diagrams used for the description that follows), however, each tube is shown as a simple cylinder for simplification.

The semiconductor device 310 shown in FIG. 10 further includes conductors 318, 320 connected to the ends 314*a*, 314*b*, respectively, of the inner tube 314 and means 322 for applying a voltage to the outer tube. In this semiconductor device 310, the inner tube 314 exhibiting the semiconductor-like characteristics and the outer tube 316 exhibiting the metallic characteristics form a semiconductor-metal junction. Thus, the inner tube 314 can function as a channel of the transistor, and the outer tube 316 can act as a gate. In this case, the current flowing, for example, from the conductor 318 to the conductor 320 through the inner tube 314 having the semiconductor-like characteristics, can be controlled in accordance with the voltage applied by the voltage application means 322 from an external source. The ends 314*a*, 314*b* of the inner tube 314 extend out from the ends 316*a*, 316*b*, respectively, of the outer tube 316 in FIG. 10. As long as the conductors are kept out of contact with the outer tube 316 having metallic characteristics, the ends 314*a*, 314*b* of the inner tube 314 may be located, to form a junction with the conductors 318, 320, in the same plane as the ends 316*a*, 316*b*, respectively, of the outer tube 316.

Figure 9:
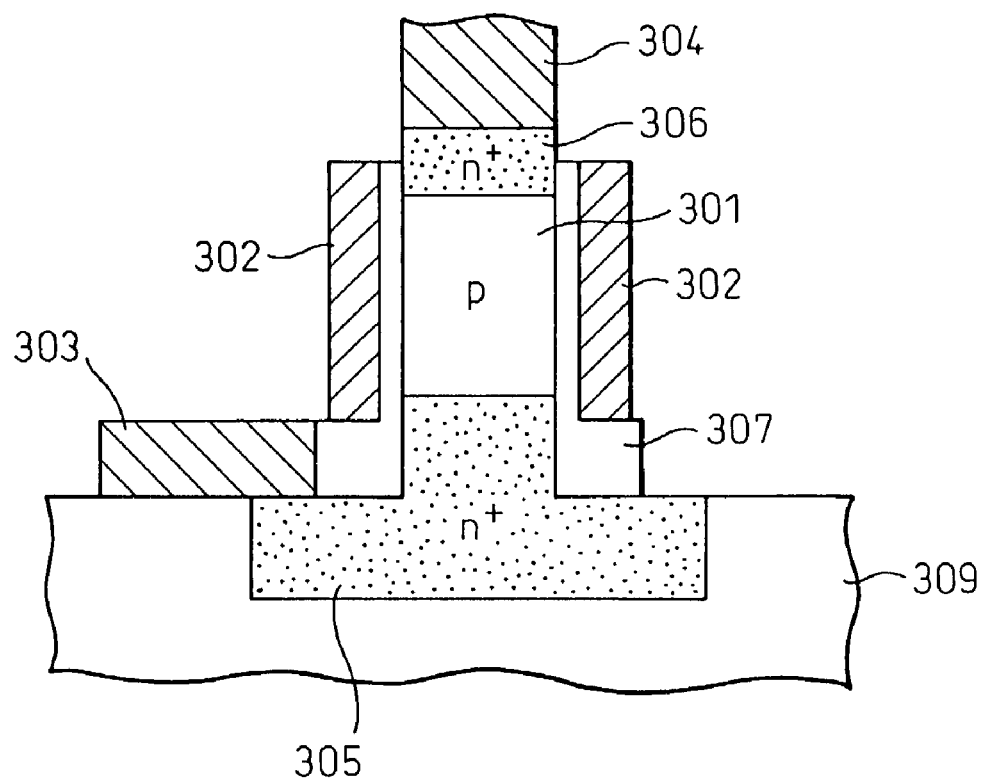
FIG. 9 illustrates a semiconductor device having a surround gate structure.

In this semiconductor device 310, the inner tube 314 corresponding to the channel is surrounded by the outer tube 316 corresponding to the gate. This structure is seen to be identical with the surround gate structure shown in FIG. 9. In this semiconductor device 310, the hole density in the inner nanotube 314 is reduced for a decreased current in the channel by applying a positive voltage to the outer nanotube 316. Also, in this structure, the electric lines of force extending from the gate cannot escape out of the channel, and therefore the effect of suppressing the short channel effect is especially high, and a superior turn-off characteristic can be achieved.

Alternatively, a multilayer structure having an inner carbon nanotube of semiconductor-like characteristics, an outer carbon nanotube of metallic characteristics, and a boron nitride (BN) nanotube interposed between the inner and outer carbon nanotubes, as an insulating layer, may be used. Such a multilayer structure having an interposed BN nanotube can be made by, for example, forming a carbon nanotube from fullerene pea-pods inside an outer carbon nanotube, converting the inside carbon nanotube into a BN nanotube by a chemical reaction, and then forming a carbon nanotube from fullerene pea-pods inside the BN nanotube.

The conductors 318, 320 may be formed of any material which can be connected electrically to the inner tube 314. It may be, for example, a metal formed into the shape of a probe or a carbon nanotube having metallic characteristics. Also, the connection with the inner tube 314 is not necessarily limited to the connection between the ends 314*a*, 314*b* of the inner tube and the ends of the conductors 318, 320, respectively, as shown in FIG. 10. For example, the conductors 318, 320 may be connected to the side surfaces, respectively, of the inner tube 314 extended and exposed out of the ends 316*a*, 316*b* of the outer tube. Further, in the case where the outer tube of the multilayer carbon nanotube is segmented, the segments of the outer tube not in direct contact with the segment working as a gate can be also used as the conductors 318, 320, as explained later.

Generally, the means 322 for applying a voltage to the outer tube 316 may be a conductor. This voltage application means 322 may be connected directly to the outer tube 316 as schematically shown in FIG. 10 or may be configured in such a manner as to apply a voltage to the outer tube 316 through an insulating material (not shown) inserted between the outer tube 316 and the voltage application means 322.

Now, a semiconductor device according to another embodiment of the invention will be explained. As shown in the plan view of FIG. 11A and the sectional view of FIG. 11B, the semiconductor device according to this embodiment has two portions of the multilayer carbon nanotube 332, where the outer tube having electric characteristics is lacking but the inner tube 334 having semiconductor-like characteristics is present. As a result, the semiconductor device includes a source region S, a drain region D and a channel region C, each of which is electrically insulated and isolated from the others. In the source region S, the source electrode 338 constituting an ohmic electrode is in ohmic contact with the outer tube 336S having metallic characteristics. In the drain region D, the drain electrode 340 making up an ohmic electrode is also in ohmic contact with the outer tube 336D. In the channel region C, on the other hand, the gate electrode 342 constituting a rectifying electrode is connected (in ohmic contact) with the outer tube 336C having metallic characteristics, thereby forming a gate. The current flowing in the inner tube 334 of the channel region C is controlled by the rectification contact between the gate and the inner tube 336C. In this way, this semiconductor device also has a surround gate structure and therefore exhibits a superior turn-off characteristic. Also, this semiconductor device corresponds to a field effect transistor using for a gate the Schottky junction between a metal and a semiconductor, and for this reason, is suitable to be used as a semiconductor device for high-frequency operation.

The source electrode 338 and the drain electrode 340 can be generally formed of a metallic material such as Ni, Ti, Pt or a Pt—Au alloy for securing a low contact resistance. The gate electrode 342, on the other hand, can be formed of a metal material such as Al or W or polycrystalline silicon. The source electrode 338, the drain electrode 340 and the gate electrode 342 are arranged, in FIGS. 11A and 11B, in contact with the whole length of the side surfaces of the outer tubes 336S, 336D, 336C, respectively, of the carbon nanotube 332, but may alternatively be arranged in partial contact therewith.

Figure 11A:
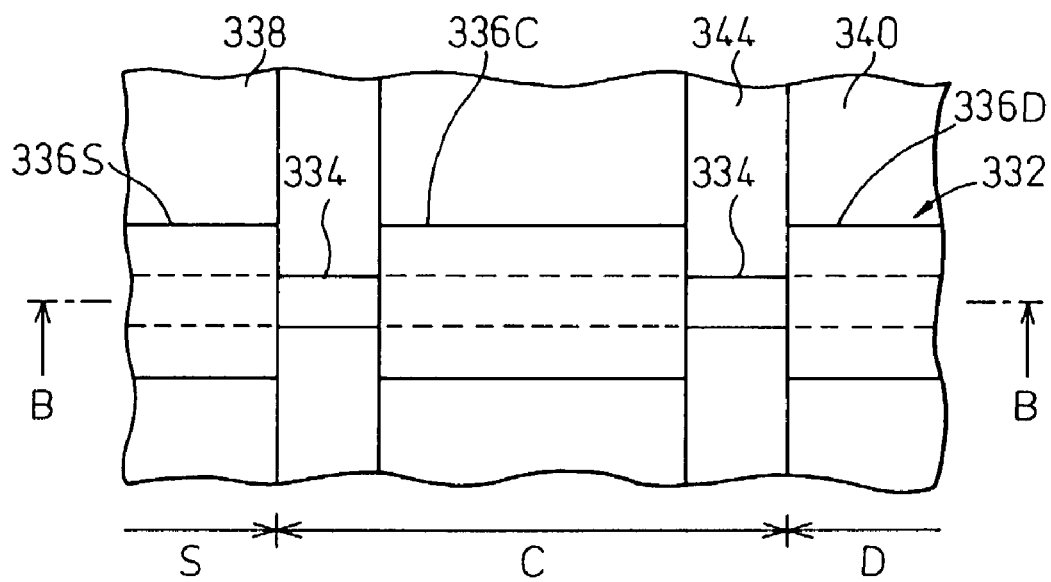
FIGS. 11A and 11B illustrate an semiconductor device according to another embodiment of the invention.
Figure 11B:
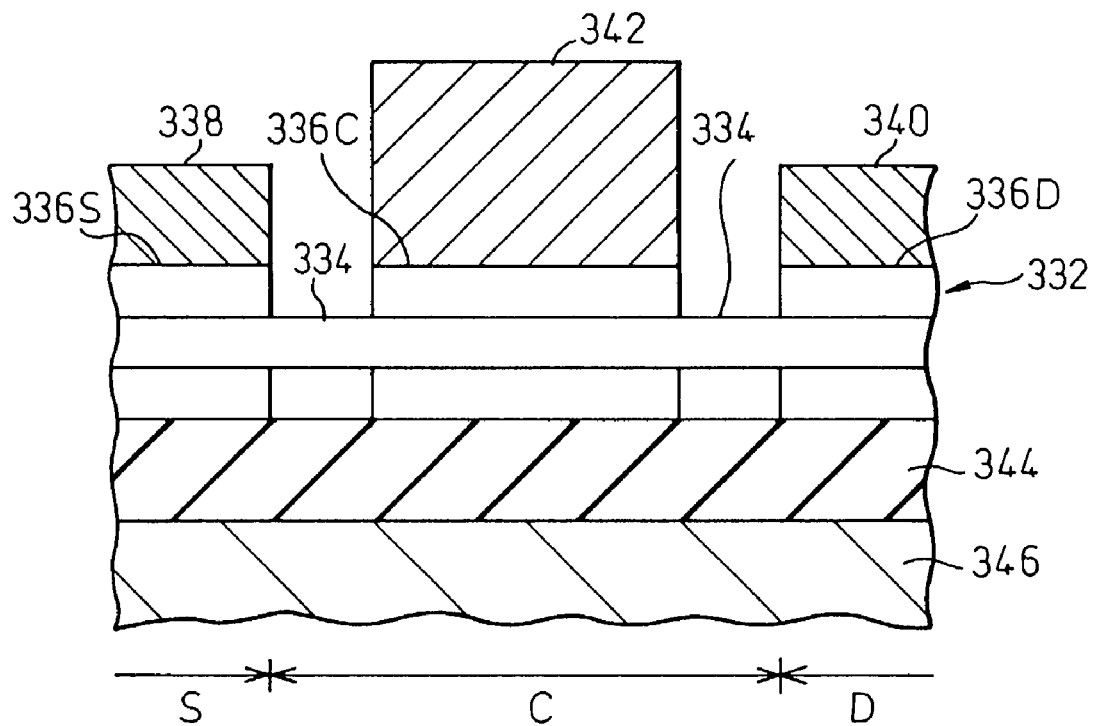

As clearly shown in FIG. 11B, the carbon nanotube 332 is generally arranged on an arbitrary insulating layer 344. The insulating layer 344 may be a single substrate of an insulating material or an insulating material layer arranged on another substrate 346 of a different material. Also, the insulating layer 344 may be a semiconductor layer having a low conductivity.

Figure 12:
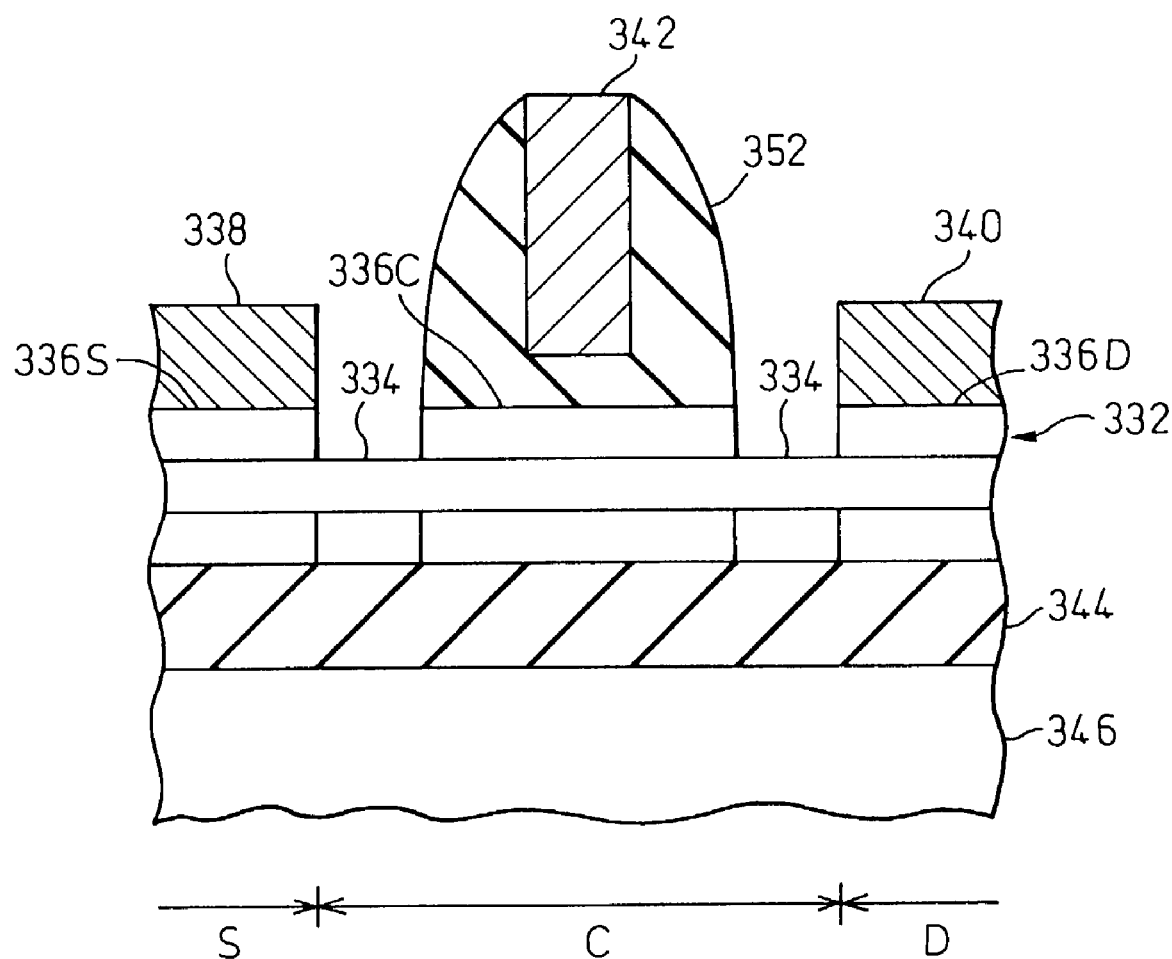
FIG. 12 illustrates a semiconductor device according to still another embodiment of the invention.

A semiconductor device according to yet another embodiment of the invention will be explained with reference to the sectional view of FIG. 12 similar to FIG. 11B. In FIG. 12, the component parts or members identical to those depicted in FIGS. 11A and 11B are designated by the same reference numerals, respectively, and will not be described below again.

In the semiconductor device shown in FIG. 12, an insulating member 352 is arranged between the gate electrode 342 and the outer tube 336C of the channel region C and along the side surfaces of the gate electrode 342. Except for this point, the semiconductor device shown in FIG. 12 is similar to the semiconductor device explained with reference to FIGS. 11A and 11B. With a semiconductor device having this structure, the insulating member 352 inserted between source and gate and between gate and drain can reduce the gate capacity. As a result, the semiconductor device is suitable especially for high-speed switching operation and high integration.

Figure 13A:
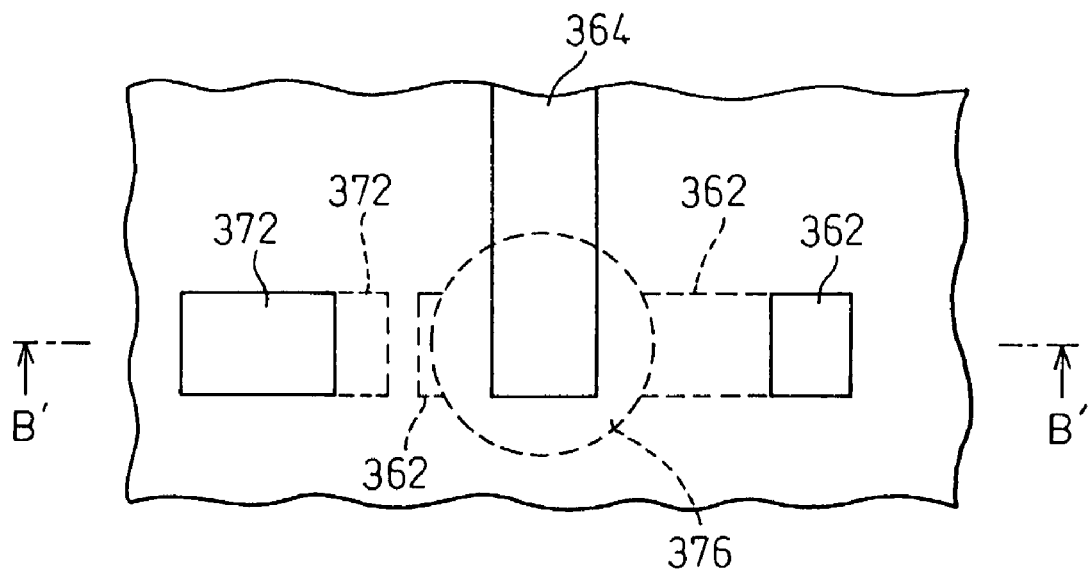
FIGS. 13A and 13B illustrate a semiconductor device according to yet another embodiment of the invention.
Figure 13B:
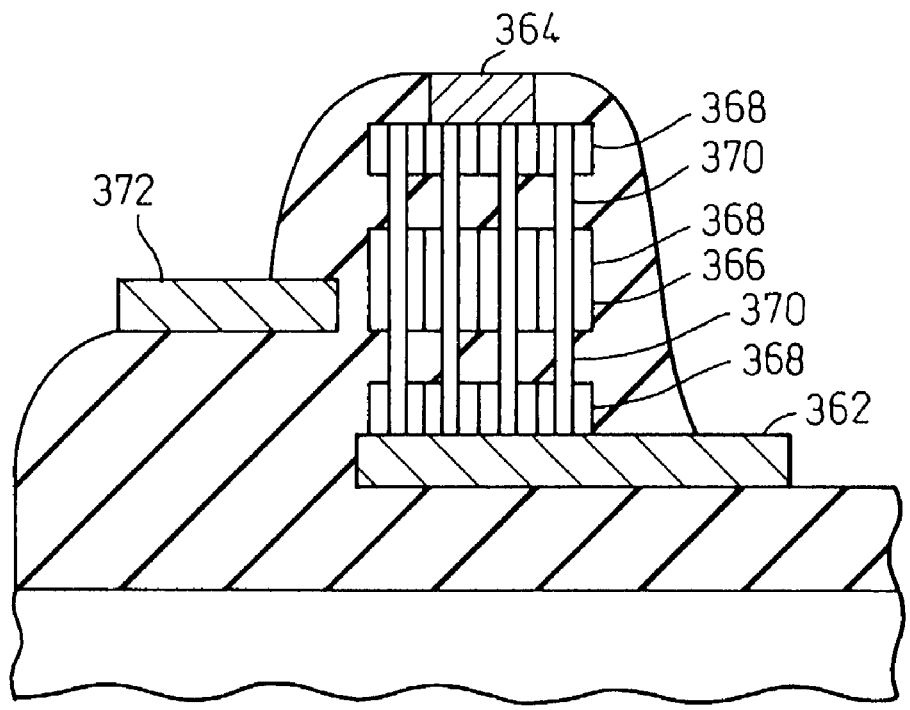

A semiconductor device according to a further embodiment of the invention is shown in the plan view of FIG. 13A and the sectional view of FIG. 13B. Unlike in every embodiment of the invention described above in which the longitudinal axis of the carbon nanotube 332 is parallel to the surface of the substrate 346, the semiconductor device according to this embodiment of the invention is such that the longitudinal axis of the carbon nanotube is perpendicular to the substrate surface. Thus, the semiconductor device according to this embodiment is of vertical type.

In FIGS. 13A and 13B, a plurality of carbon nanotubes 366 are arranged vertically between a lower source electrode 362 and an upper drain electrode 364. These carbon nanotubes 366 have a multilayer structure as described above, and the outer tube 368 having metallic characteristics is cut and isolated at two portions thereby to expose the inner tube 370 having semiconductor-like characteristics. A gate electrode 372 is arranged adjacently to the remaining central portion (corresponding to the channel region) of the outer tube. The other portions shown in FIGS. 13A and 13B are formed of an insulating material. The semiconductor device shown includes an insulating material between the nanotubes 366 and the gate electrode 372. This gate electrode 372 can also be brought into contact with the outer tube of the nanotubes having a multilayer structure, as earlier described.

The semiconductor device shown in FIGS. 13A and 13B includes a plurality of carbon nanotubes 366 of a multilayer structure, which form a bundle 376 shown schematically in FIG. 13A. In this semiconductor device, a single carbon nanotube 366 having a multilayer structure may be employed for the semiconductor device. However, a bundle of a plurality of the nanotubes shown in the drawings, lead to the special advantage described below. In the semiconductor device having a bundle of the carbon nanotubes, even the bundle of a plurality of multilayer nanotubes for the channel portion retains an outer nanotube 368 having metallic characteristics. Therefore, the gate is maintained at an equal potential by the mutual contact between the metal surfaces of these portions. Normally, the larger the channel diameter of a vertical transistor, the higher the threshold voltage. In this semiconductor device, however, the gate is wound on each tube (the outer tube having metallic characteristics). As long as the tube diameter remains the same, therefore, the threshold voltage remains unchanged with the number of the tubes. Consequently, by bundling a plurality of nanotubes constituting a channel, a greater amount of current can be supplied for a further improved current driving performance.

Now, the process of fabricating the semiconductor devices described above will be explained.

Figure 14A:
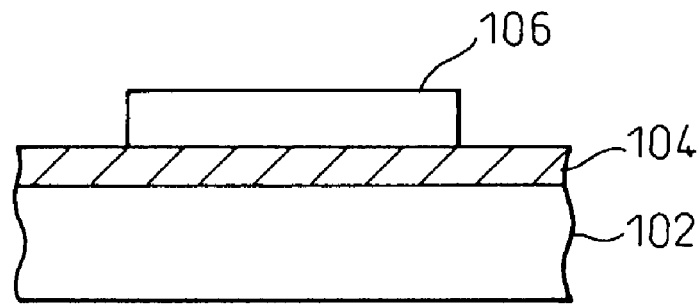
FIGS. 14A to 14C illustrate the first half process of fabricating the semiconductor device shown in FIG. 11, FIGS. 15A to 15C illustrate the second half process of fabricating the semiconductor device shown in FIG. 11, FIGS. 16A to 16D illustrate the process of fabricating a semiconductor device having an insulating film interposed between the gate electrode and the carbon nanotube.
Figure 14B:
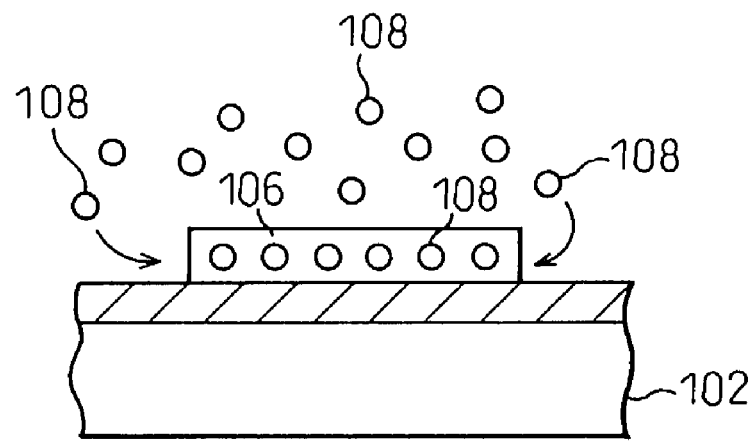
Figure 14C:
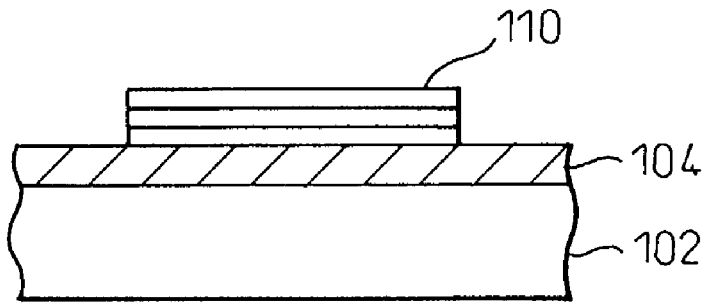

The semiconductor device described with reference to FIGS. 11A and 11B can be fabricated in the following manner, for example. As shown in FIG. 14A, the surface of an n-type silicon substrate 102 is deposited with a silicon oxide film 104 to the thickness of 100 nm, on which carbon a nanotube is arranged. Using a resist pattern (not shown), the exposed end portions of the carbon nanotube are ashed with oxygen plasma, and the resist pattern is removed to thereby prepare a carbon nanotube 106 of the required length. Then, as shown in FIG. 14B, the nanotube 106 on the substrate 102 is exposed to an environment containing fullerene (Cxx, such as C60) 108, which is injected into the nanotube 106 by the strong attractive force of the nanotube 106 to thereby prepare what is called a pea pod. The carbon nanotube 106 having the pea pod structure (FIG. 14B) is annealed at 1200° C. to thereby prepare a multilayer carbon nanotube 110 (FIG. 14C). The distance between the inner layer and the outer layer can be varied by a size of fullerene used (Cxx).

Figure 15A:
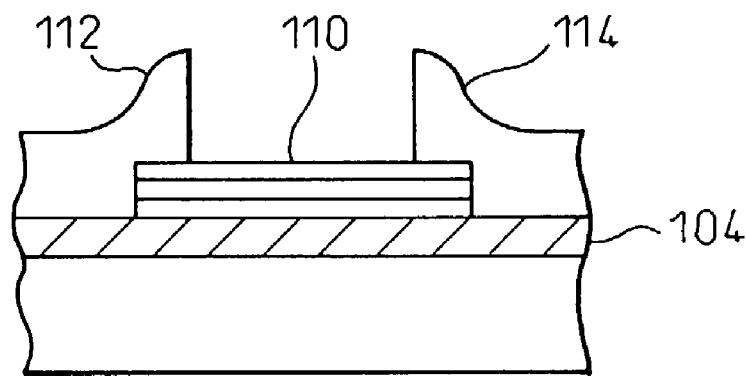

The multilayer nanotube 110 and the underlying oxide film 104 are then covered by forming thereon a resist pattern (not shown) having openings for the source and drain electrodes. After depositing by evaporation a Pt—Au alloy as a metal for the source and drain electrodes, the metal located on the area other than the openings of the resist pattern is removed by the lift-off process to thereby form a source electrode 112 and a drain electrode 114 (FIG. 15A). Using a resist pattern (not shown) having an opening at the central portion of the nanotube 110, a gate metal (w) is deposited, and the gate electrode 116 (FIG. 15B) is formed similarly by lift-off. Then, the oxygen plasma etching is carried out for a predetermined time using the metal electrodes 112, 114, 116 as masks, to thereby remove only the outer tube of the multilayer nanotube 110 exposed. In this way, the semiconductor device 100 having the structure described above with reference to FIGS. 11A and 11B (FIG. 15C) is fabricated.

Figure 15B:
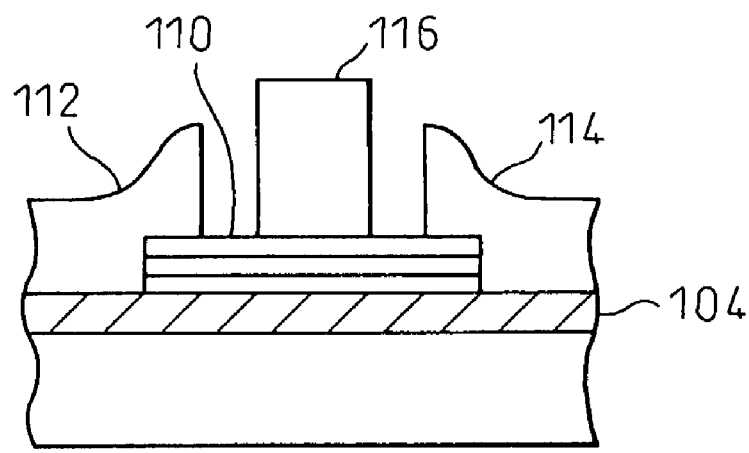
Figure 15C:
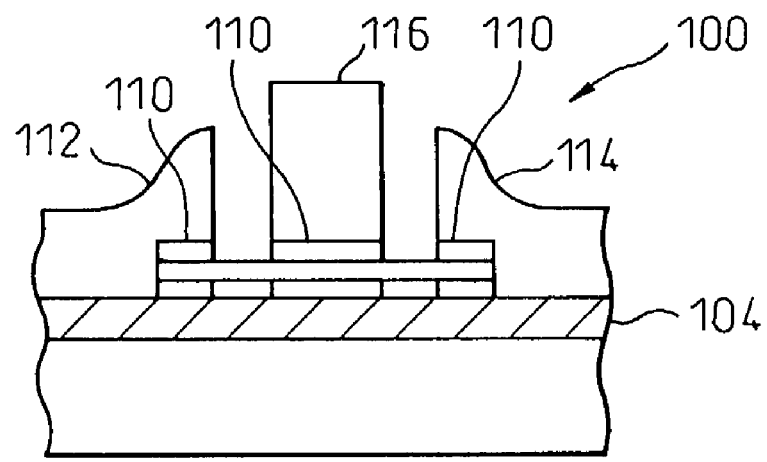

The outer tube can be also removed by a method other than the oxygen plasma etching described above. For example, after the source electrode 112, the drain electrode 114 and the gate electrodes 116 are formed, as shown in FIG. 15B, the outer tube alone can be removed by supplying a current between gate and source and between gate and drain. In this case, since a current flows more easily in the outer tube having metallic characteristics than in the inner tube having semiconductor-like characteristic high in resistance, the carbon making up the outer tube not covered with the electrode metal disappears earlier while retaining the inner tube alone.

After preparing the multilayer nanotube 110 described with reference to FIG. 14C, an insulating film (a silicon nitride or oxide film) (not shown) covering the multilayer nanotube 110 and the underlying oxide film 104 may be formed, to thereby fabricate a semiconductor device including an insulating film between the gate electrode 116 and the underlying nanotube 110. This semiconductor device is fabricated by the method described below.

Figure 16A:
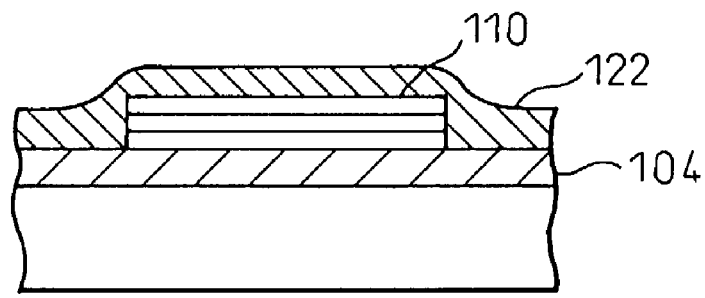
Figure 16B:
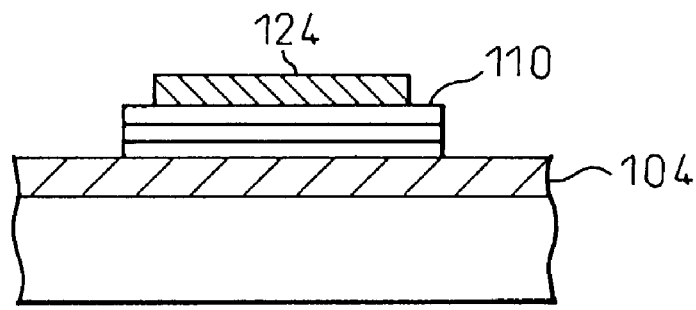
Figure 16C:
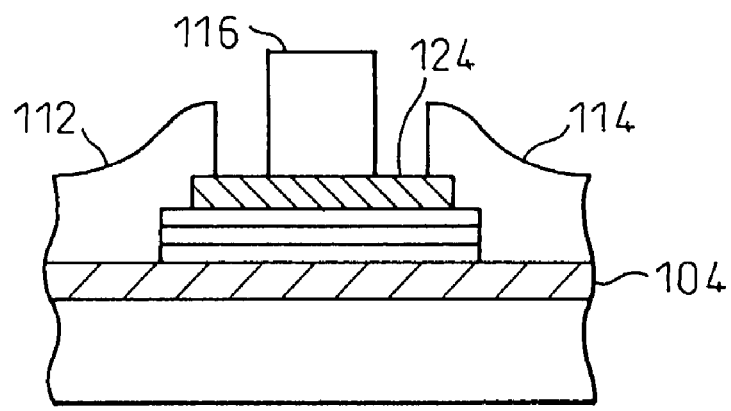
Figure 16D:
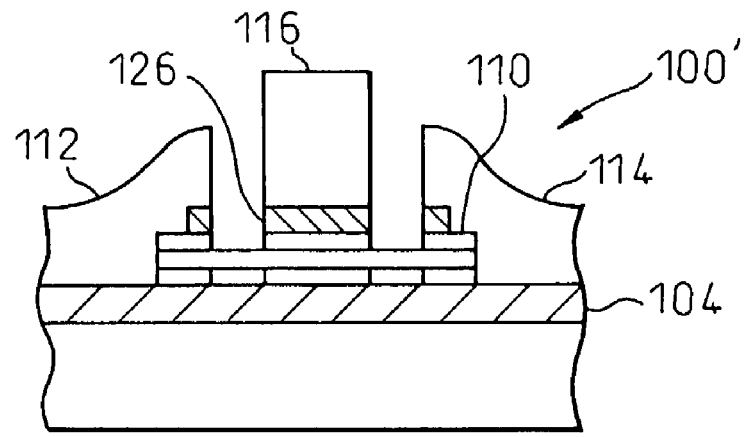

As shown in FIG. 16A, a silicon nitride film 122 (or a silicon oxide film) covering the multilayer nanotube 110 and the underlying oxide film 104 is formed to the thickness of 2 nm. A resist pattern (not shown) is formed on the nitride film 122, which is then etched to leave an insulating film 124 so as to expose the ends of the nanotube 110 as shown in FIG. 16B. The source electrode 112 and the drain electrode 114 are then formed, as explained with reference to FIGS. 15A to 15C earlier, and further the gate electrode 116 is formed on the insulating film 124 (FIG. 16C). After etching the exposed portion of the insulating film 124, the outer tube of the nanotube 110 is removed by oxygen plasma ashing, thereby producing a semiconductor device 100' having a gate insulating film 126 as shown in FIG. 16D.

A semiconductor device having a side wall of an insulating material on the side surface of the gate electrode shown in FIG. 12 can be fabricated as follows.

Figure 17A:
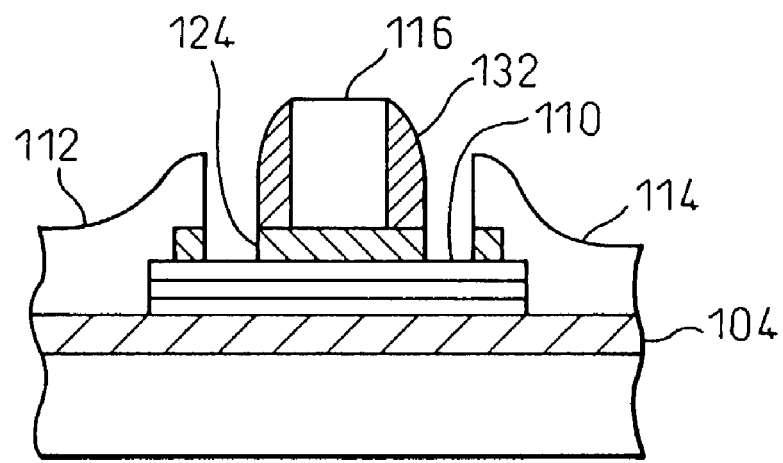
FIGS. 17A and 17B illustrate the process of fabricating a semiconductor device having a side wall of an insulating material on the side surface of the gate electrode shown in FIG. 12, FIGS. 18A to 18C illustrate one part of the fabrication process of the semiconductor device shown in FIG. 13, FIGS. 19A to 19C illustrate the next part of the fabrication process of the semiconductor device shown in FIG. 13, FIGS. 20A and 20B illustrate the second next part of the fabrication process of the semiconductor device shown in FIG. 13, FIGS. 21A and 21B illustrate the remaining part of the fabrication process of the semiconductor device shown in FIG. 13.
Figure 17B:
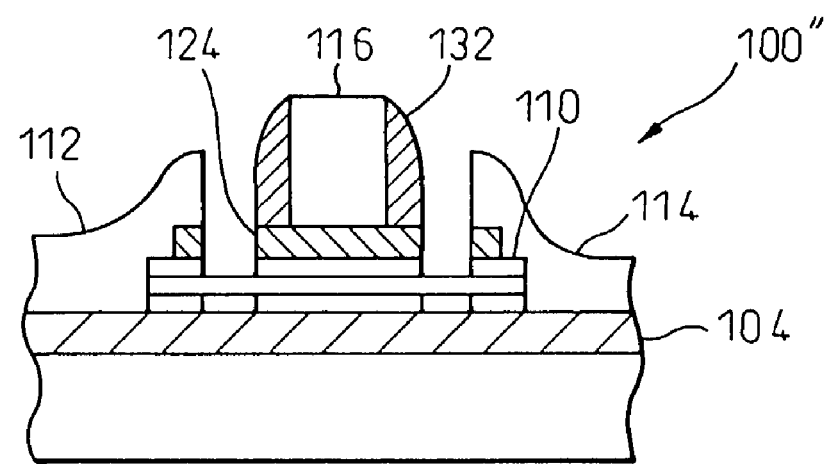

After the process of forming the gate electrode 116 on the insulating film 124 shown in FIG. 16C, a silicon nitride film (not shown) 100 nm thick is formed and etched, thereby forming a nitride side wall 132 on the side surface of the gate electrode 116 (at the same time, the nitride film 124 (FIG. 16C) that has thus far been exposed on the nanotube 110 is also etched), as shown in FIG. 17A. The oxygen plasma etching is subsequently carried out for a predetermined time length using the metal electrodes 112, 114, 116 and the nitride side wall 132 as a mask, and only the outer tube of the multilayer nanotube 110 exposed is removed, thereby producing a semiconductor device 100" having the structure as described above with reference to FIG. 12 (FIG. 17B).

Now, an explanation will be given of a method of fabricating a semiconductor device having a vertical structure explained with reference to FIGS. 13A and 13B earlier.

Figure 18A:
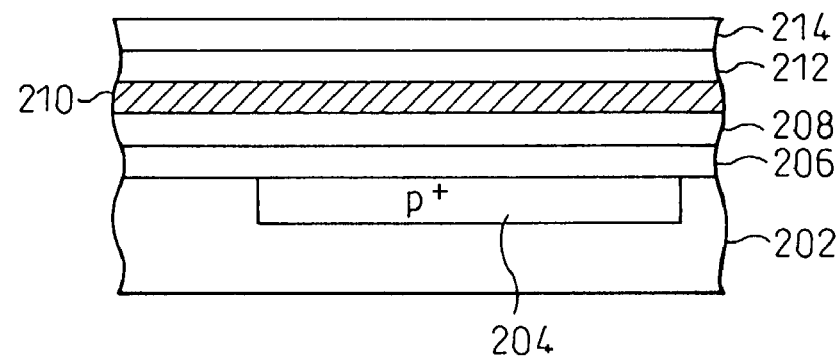
Figure 18B:
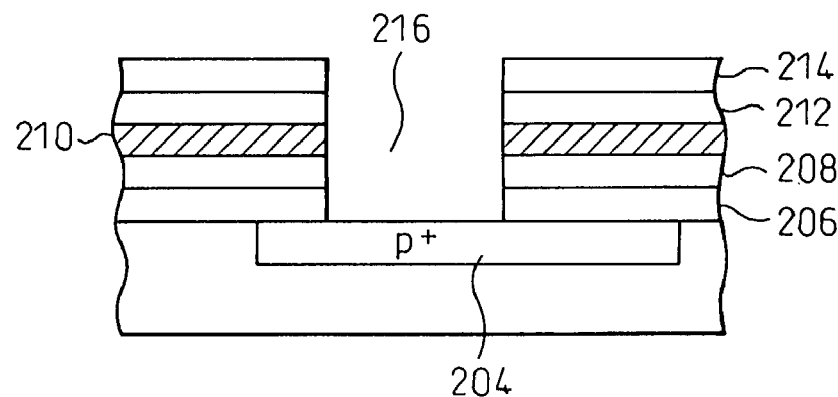
Figure 18C:
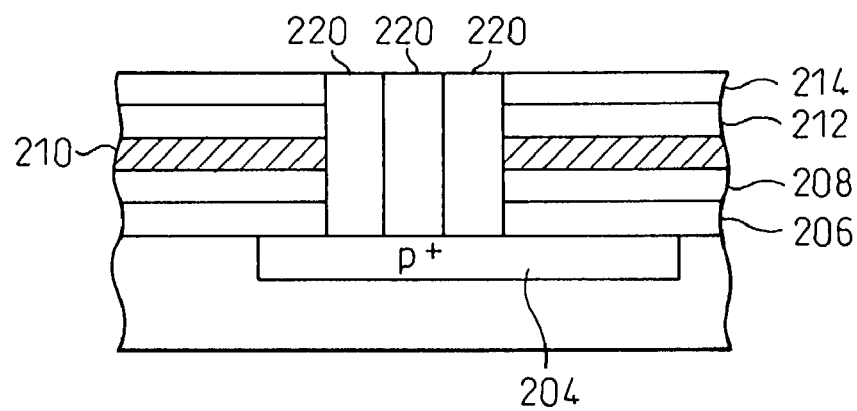
Figure 19A:
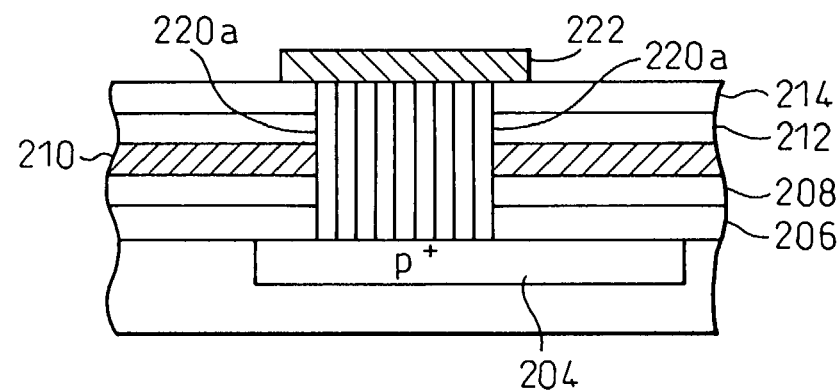

As shown in FIG. 18A, on an n-type silicon substrate 202, having a $p^+$ region 204 formed thereon by injection of As ions, is formed a silicon nitride film (50 nm) 206, a silicon oxide film (50 nm) 208, a polysilicon gate metal film (20 nm) 210, a silicon oxide film (50 nm) 212 and a silicon nitride film (50 nm) 214 in that order. A resist pattern (not shown) is then formed, and using this resist pattern as a mask, the films 214, 212, 210, 208 and 206 are selectively etched in that order, thereby forming an opening 216 exposing the $p^+$ region 204 in its bottom as shown in FIG. 18B. An Ni (or Fe or Co) film is then deposited over the entire surface, and a metal film (not shown) 1 to 10 nm thick is left only on the bottom of the opening 216 by the lift-off process. Using this metal film of Ni as a catalyst, carbon nanotubes 220 (FIG. 18C) are grown vertically in the opening 216 by CVD (chemical vapor deposition), and the forward ends of the nanotubes 220 are removed by the oxygen plasma process. In the case where the plasma CVD is used as the CVD growth method, the catalyst metal is removed by Ar sputtering. In the case of thermal CVD, on the other hand, the catalyst remains on the bottom of the opening 216, and therefore the removal process is not required. Fullerene (not shown) is then injected into the nanotube by processing it in an environment containing fullerene to thereby prepare a pea pod, as explained earlier, and a plurality of multilayer nanotubes 220$a$ (FIG. 19A) is formed by annealing. Then, a metal film (not shown) for the drain electrode is formed of TiSi, and etched using a resist pattern (not shown) to thereby form a drain electrode 222 shown in FIG. 19A.

Figure 19B:
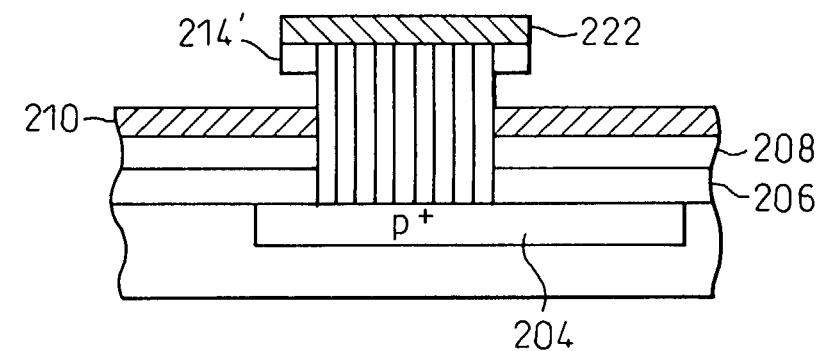
Figure 19C:
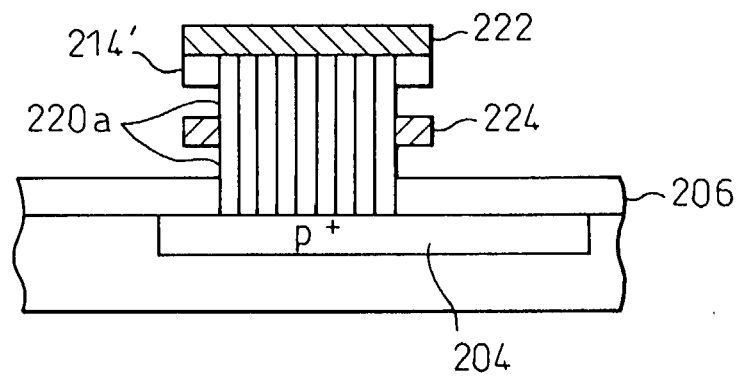
Figure 20A:
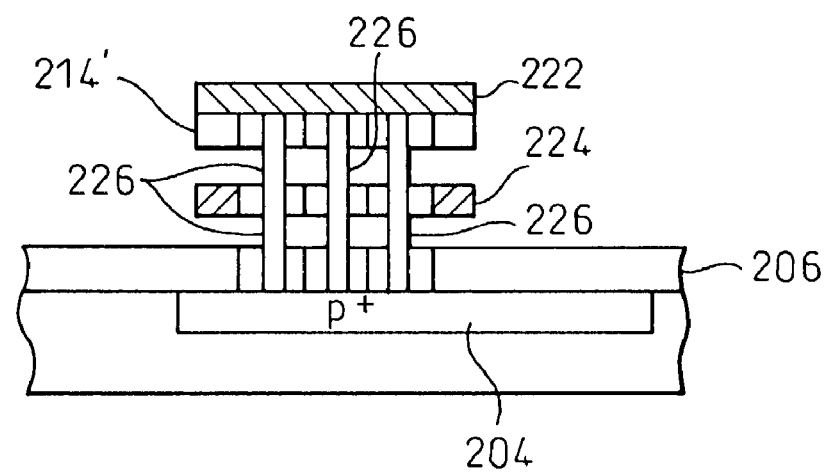

As shown in FIG. 19B, using the drain electrode 222 as a mask, the nitride film 214 (FIG. 19A) is etched anisotropically, and the oxide film under the nitride film 214' thus etched is further etched off isotropically. As shown in FIG. 19C, the gate metal film 210 (FIG. 19B) is dry etched anisotropically to form a gate electrode 224, and the oxide film under the gate electrode 224 is etched off isotropically. The multilayer carbon nanotubes 220$a$ (FIG. 19C) exposed by the removal of the oxide films is processed with oxygen plasma, so that only the exposed portion of the outer tube is removed to thereby expose the inner nanotube 226 having semiconductor-like characteristics, as shown in FIG. 20A.

Figure 20B:
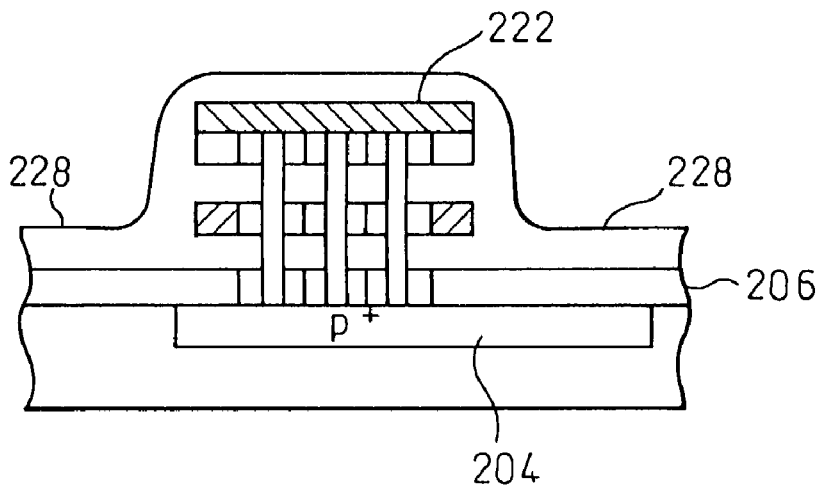
Figure 21A:
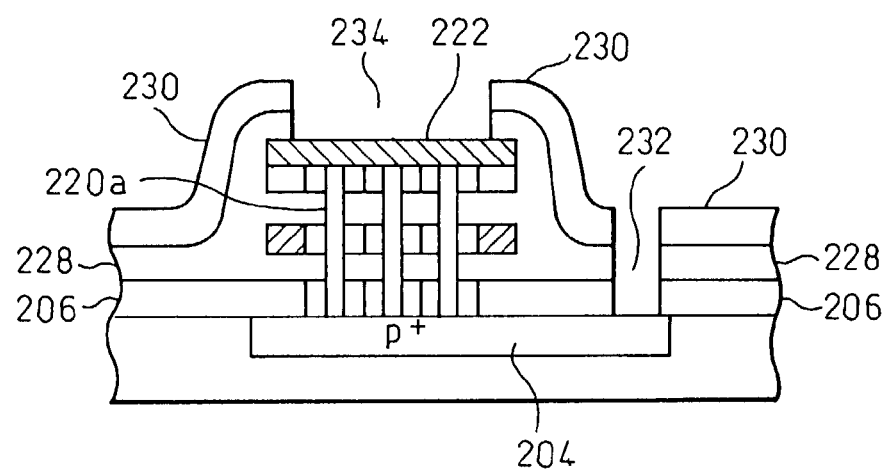
Figure 21B:
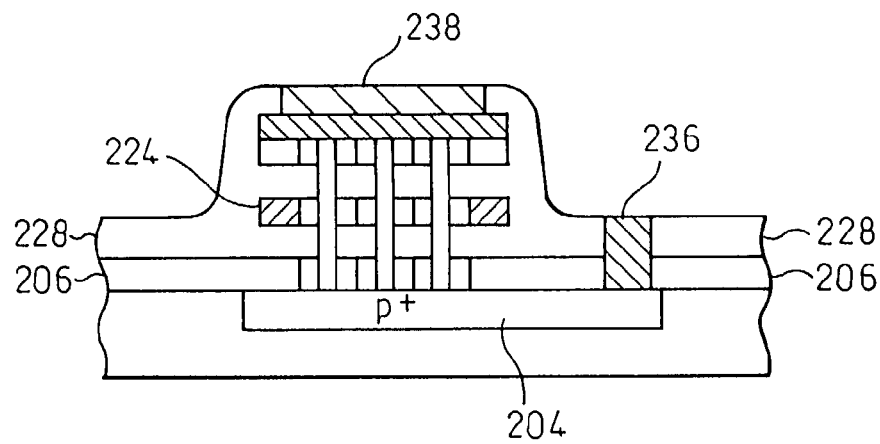
Figure 23:
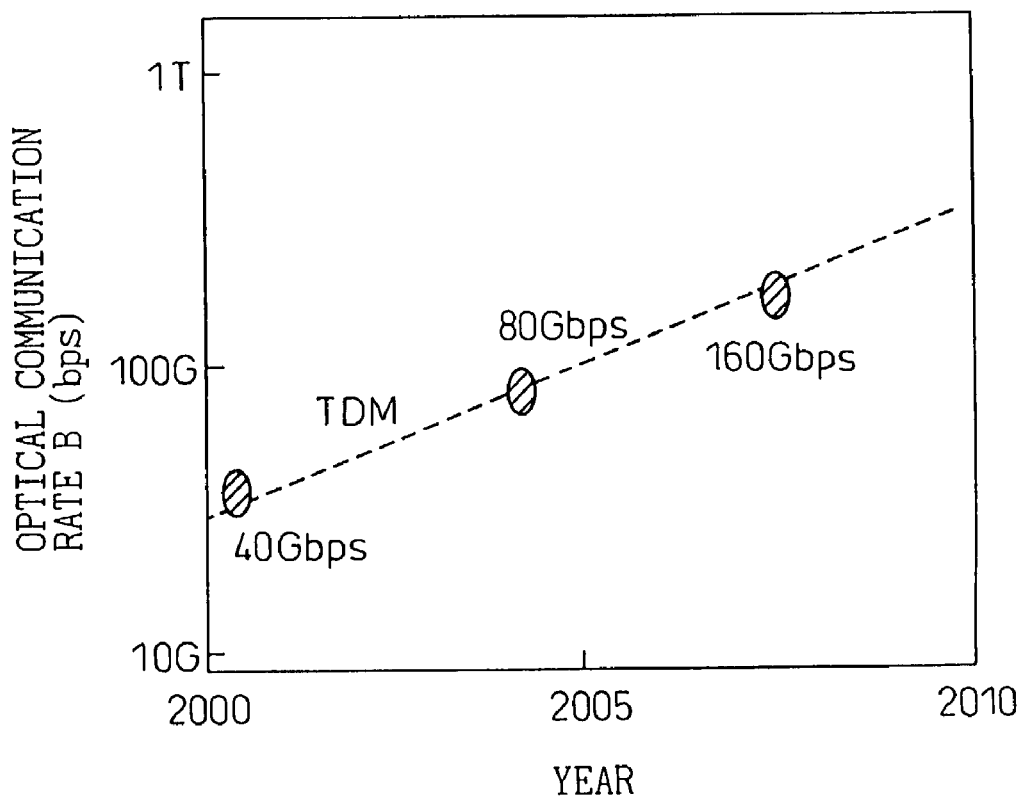
FIG. 23 is a graph showing a prediction of the future speed of optical communication.
Figure 24:
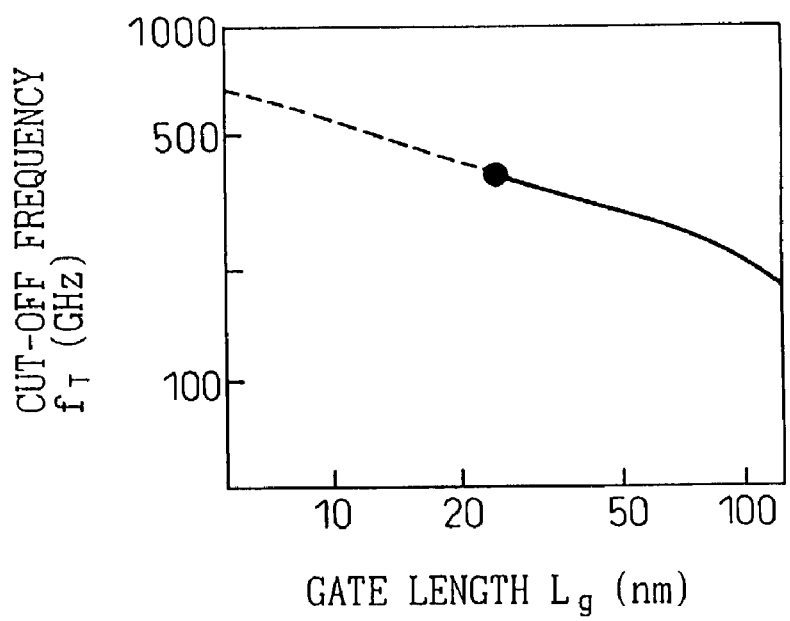
FIG. 24 is a graph showing the relation between the gate length and the cut-off frequency $f_T$ of an electronic device.

As shown in FIG. 20B, a silicon oxide film 230 having a thickness of 200 nm is then formed over the entire surface. Then, as shown in FIG. 21A, a resist pattern 230 is formed, and using the resist pattern 230 as a mask, the oxide film 228 and the nitride film 206 are etched to form electrode contact holes 232, 234. A Pt—Au alloy is deposited as a source-drain metal, and a source 236 and a drain 238 are formed by lift off while leaving the metal only in the contact holes 232, 234 (FIG. 21B). In this way, a semiconductor device having a vertical structure similar to the one explained with reference to FIGS. 13A and 13B can be fabricated.

FIG. 22 is a plan view of a semiconductor device fabricated through the process shown in FIGS. 18 to 21. In this semiconductor device, the source 236 and the drain 238 are partially exposed in the openings of the insulating film 228 of an oxide, and the bundle 240 of the multilayer carbon nanotubes 220$a$ (FIG. 21A) constituting a channel is located under the drain 238. A gate electrode 224 is located around the bundle 240 of the nanotubes, and partly exposed in another opening of the insulating film 228. The opening for exposing the gate electrode 224 can be formed, for example, after the oxide film 228 in FIG. 20A.

A semiconductor device comprising a bundle, i.e. a mass of a plurality of multilayer carbon nanotubes is not limited to the vertical structure described above, but of course may alternatively have a horizontal structure with the longitudinal axis of the nanotubes parallel to the substrate surface.

One of the characteristics of the carbon nanotube lies in that electrons constituting carriers run nondissipatively (coherently) within the nanotube. In such conduction of electrons, the electrical resistance remains constant regardless of the length of the current path. This phenomenon is observed in the case where the length of the current path is not more than the mean free path of electrons. As a result, the semiconductor device according to the invention can operate at high speed and high frequency with large current while at the same time acquiring a low noise characteristic, especially in the case where the length of the channel portion with the current flow therein controlled by the gate, i.e. the length of the continuous outer tube contacted with the gate electrode directly or opposed to the gate electrode through the insulating layer interposed therebetween, is not more than the mean free path of electrons.

Also, the carbon nanotube, which has a structure completed by self-organization, develops extremely small structural fluctuations (variations) by itself. In the carbon nanotube having a multilayer structure used in the invention, the interval between the inner and outer nanotubes is very uniform (minimum interval 0.34 nm). By configuring a semiconductor device using the carbon nanotube, therefore, the microfabrication exceeding the limit of lithography is made possible.

The foregoing description assumes a single gate electrode. However, the semiconductor device according to the invention, can be formed as a semiconductor device having two or more gate electrodes, such as a semiconductor device of "double gate" type. In such a case, an outer tube(s) in the number corresponding to the number of the gate(s) is inserted as an independent segment in the carbon nanotube portion between source and drain. More specifically, in the case of the simplest semiconductor device explained with reference to FIG. 10, one continuous outer tube suffices for one gate, and the outer tube is discontinuous and has two divided segments for two gates. On the other hand, with a semiconductor device having an outer tube segmented between gate and source and between gate and drain as explained with reference to FIGS. 11A and 11B, for example, the outer tube is segmented at two locations for one gate and at three locations for two gates.

As described above, the semiconductor device according to the invention, in which the carbon nanotube is used for the gate and the channel of the transistor, can have a surround structure especially effective for suppressing the short channel effect, and therefore can operate at high speed. Also, this invention is applicable to a semiconductor device operable at a high frequency or having a high current drive performance.

By providing the portion of the nanotube having an unsegmented outer tube contacted with the gate electrode directly or opposed to the gate electrode through an insulating layer interposed therebetween with a length of not more than the mean free path of electrons, the semiconductor device according to the invention can operate especially at high speed or high frequency, or have a low noise characteristic with large current. In addition, the use of the carbon nanotube makes it possible to provide a micro semiconductor device beyond the limit of lithography.

Further, according to the invention, a cylindrical structure configured of carbon elements which is a self-organized nano structure generally known as a carbon nanotube, is used as a gate material for the field effect transistor or a mask material for forming a pattern by dry etching.

The carbon nanotube, which is a nano structure formed by the self-organized growth of carbon elements, has the feature that the dimensional fluctuations are very small. It is known that the carbon nanotube having a metallic electrical conductivity has such a characteristic that, in the absence of lattice defects, the charge is conducted nondissipatively (ballistically) within the nanotube, and it has a quantum resistance (12.5Ω) which is not dependent on the length thereof.

According to this invention, there is provided a field effect transistor having a micro gate free of dimensional fluctuations, particularly by using a carbon nanotube having a diameter not more than 10 nm for the gate electrode of the transistor or for fabrication thereof. The fabrication technique for forming a micro pattern using the carbon nanotube as a mask is applicable not only to the gate of the transistor but also when forming an especially fine pattern for the semiconductor device or the like.

Figure 25:
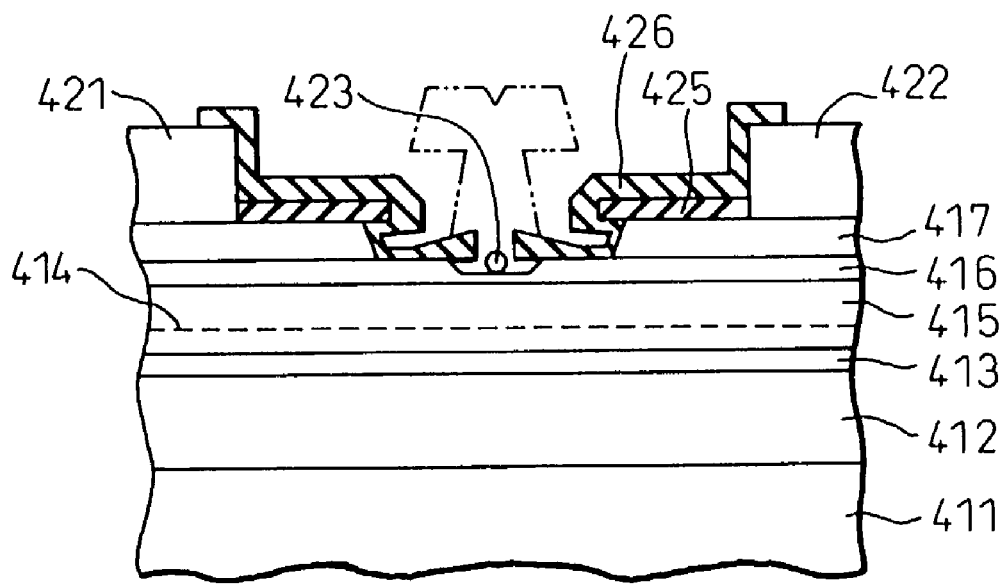
FIG. 25 illustrates a field effect transistor having the HEMT structure according to an embodiment of the invention.

FIG. 25 shows a field effect transistor according to a first embodiment of the invention. By way of comparison, FIG. 26 shows a conventional field effect transistor.

Figure 26:
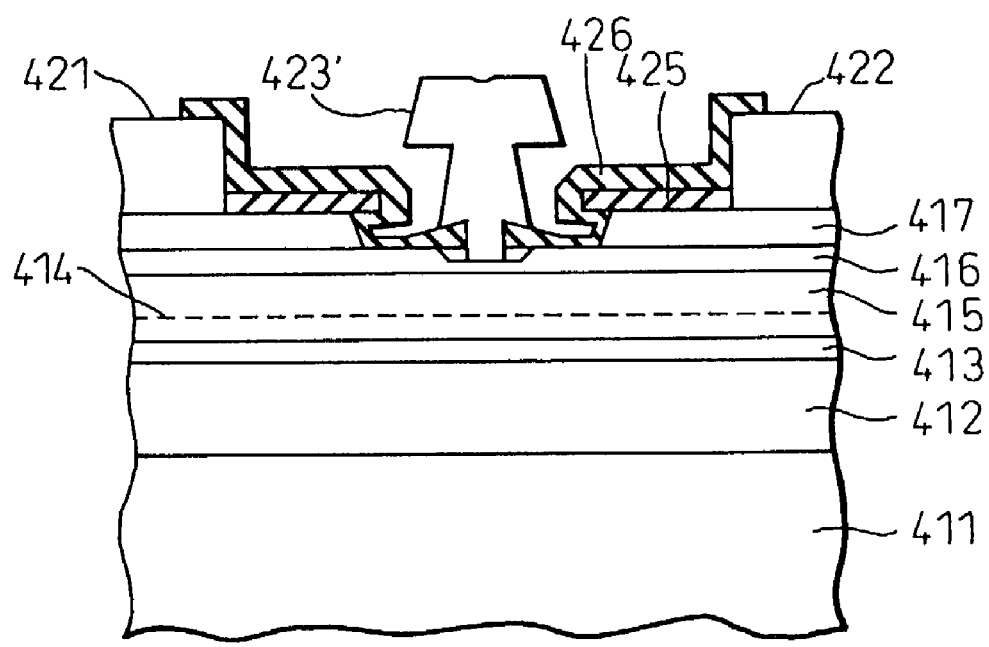
FIG. 26 illustrates a conventional field effect transistor having the HEMT structure.

Referring to FIGS. 25 and 26, the field effect transistor according to the prior art (FIG. 26) and the one according to the invention (FIG. 25) both comprise a substrate 411 formed of InP, on which a hetero junction structure for HEMT (high electron mobility transistor) is formed. Specifically, an InAlAs buffer layer 412, an InGaAs channel layer 413, an InAlAs electron supply layer 415 with the δ doping 414 of Si donors, an InP cap layer 416 and an n$^+$-InGaAs ohmic layer 417 are formed in that order by MBE (molecular beam epitaxial growth) or MOCVD (metal organic chemical vapor deposition). The source 421 and the drain 422 are formed of AuGe/Ni/Au as an ohmic electrode, and subjected to an alloying process for reducing the resistance at the temperature of about 450° C. The difference between the field effect transistor according to the invention (FIG. 25) and the conventional field effect transistor (FIG. 26) lies in that, as a material of the gate electrodes 423 (FIG. 25 for the invention) and 423' (FIG. 26 for the prior art), the invention uses the carbon nanotube having metallic characteristics while the prior art employs WSi or the like. This difference in the material for configuring the gate electrode is reflected in the difference in shape of the gate electrodes 423, 423'. As described below, the carbon nanotube according to the invention is arranged in the site of active layer of the transistor and makes up the portion of the gate, called a "finger", while the portion for electrical connection of the finger with an externally connecting means (i.e. the lead-out portion of the gate electrode) is formed in the same way as in the conventional transistor and therefore has a similar shape to the conventional one. The gate 423 of FIG. 25 representing the transistor according to the invention, therefore, is connected to the lead-out portion of the gate electrode (indicated by an imaginary line in the drawing), which is behind the gate 423, as depicted in the drawing. The surfaces of the portions other than the source 421, the drain 422 and the gates 423, 423' are coated with insulating films 425, 426 of SiO$_2$ as a surface passivation film.

Figure 27A:
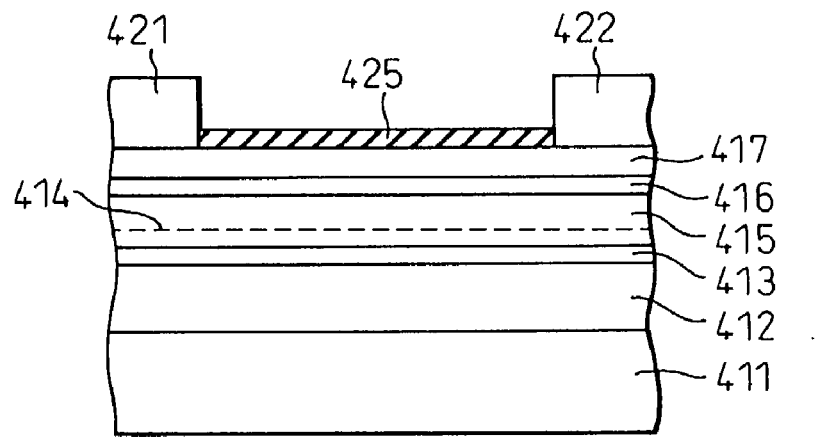
FIGS. 27A to 27C illustrate one part of the fabrication process of the conventional field effect transistor.
Figure 27B:
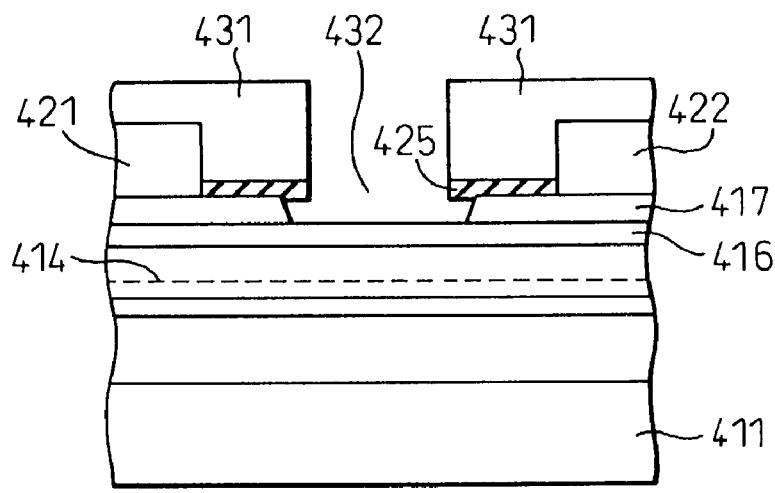
Figure 27C:
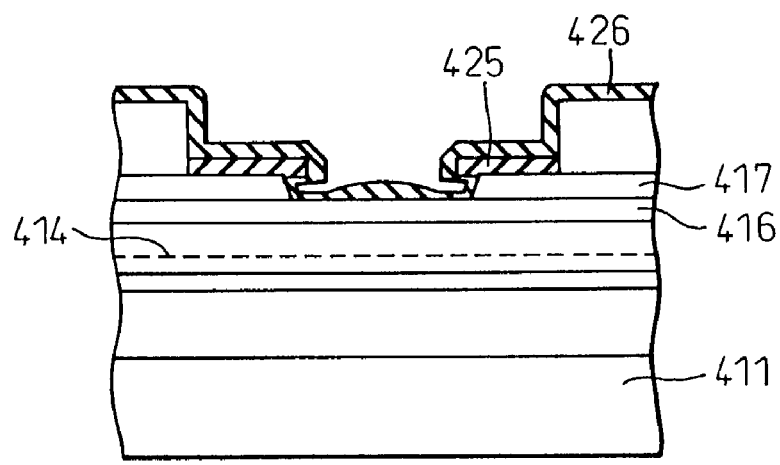
Figure 28A:
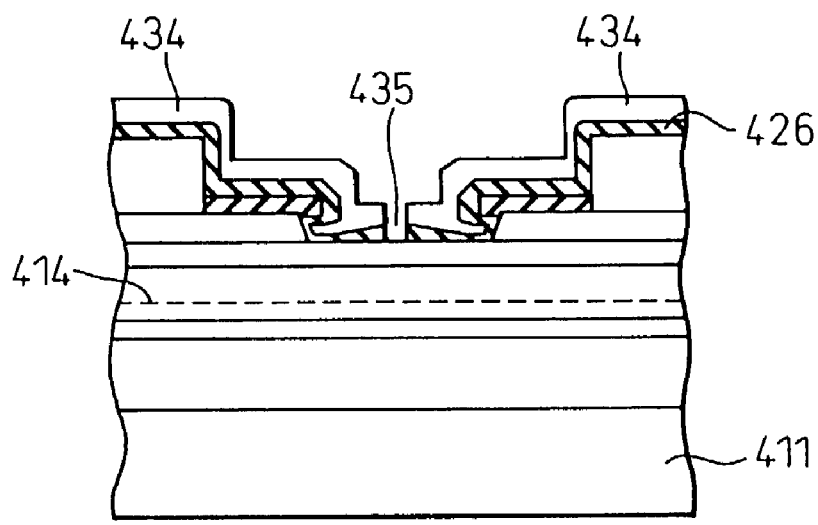
FIGS. 28A and 28B illustrate another part of the fabrication process of the conventional field effect transistor.
Figure 28B:
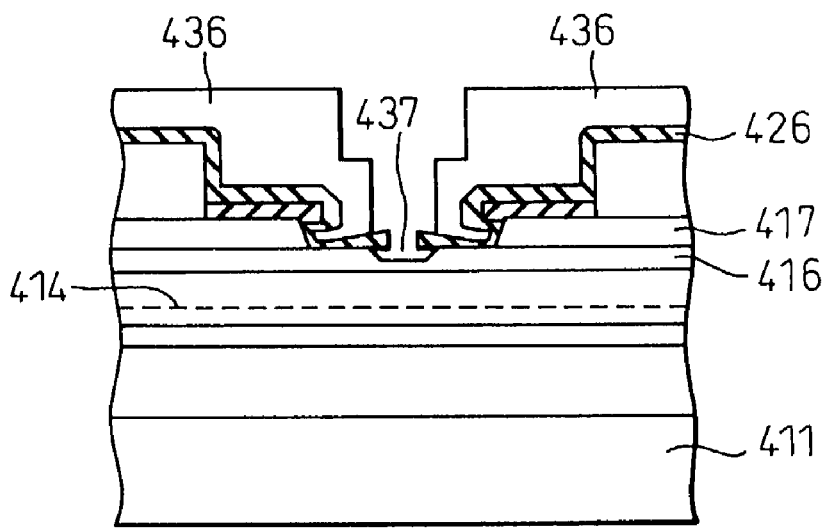
Figure 29:
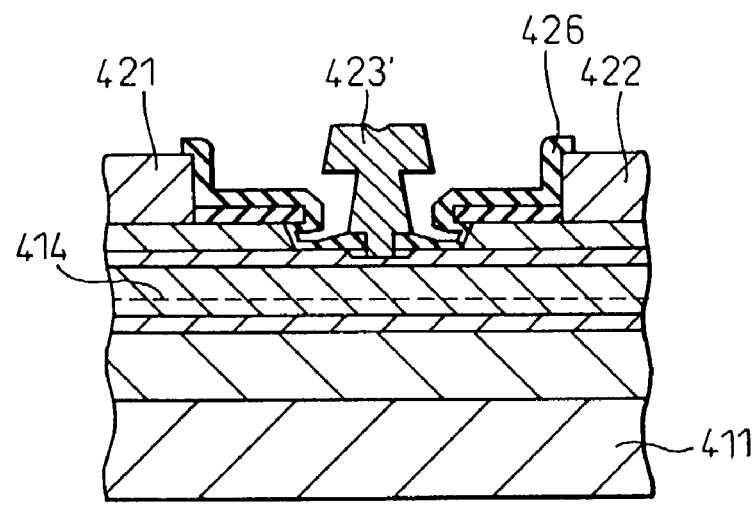
FIG. 29 illustrates the remaining part of the fabrication process of the conventional field effect transistor.

The gate electrode 423' of the conventional field effect transistor is fabricated in the following manner. FIG. 27A shows the source 421, the drain 422 and the SiO$_2$ film 425 formed on the InP substrate 411, which is provided with the various layers 412, 413, 415, 416, 417 described above. As shown in FIG. 27B, a resist parttern 431 is formed on the substrate surface, and using the resist parttern as a mask, the SiO$_2$ film 425 and the n$^+$-InGaAs layer 417 are etched to thereby form an opening 432 for fabricating a gate. After removing the resist pattern 431, an SiO$_2$ film 426 is then formed over the entire surface of the substrate (FIG. 27C). As shown in FIG. 28A, a resist pattern 434 for fabricating the gate is then formed, and using it as a mask, the SiO$_2$ film 426 is etched to form an opening 435. After removing the resist pattern 434, another resist pattern 436 is formed so as to expose a part of the SiO$_2$ film 426, as shown in FIG. 28B. Using the resist pattern 436 and the exposed SiO$_2$ film 426 as a mask, the InP layer 416 is then etched to form a hole 437. Then, a gate electrode material is deposited and a gate electrode 423' is formed using the lift-off process, as shown in FIG. 29. Substantially, a part of the SiO$_2$ film 426 is removed, so that the source 421 and the drain 422 are partly exposed to thereby produce a field effect transistor according to the prior art described with reference to FIG. 26. In this way, the gate electrode 423' of the conventional field effect transistor is fabricated using the lithography and the lift-off process and, accordingly, a practically applicable gate electrode having a size of smaller than 25 nm cannot be fabricated.

Figure 30:
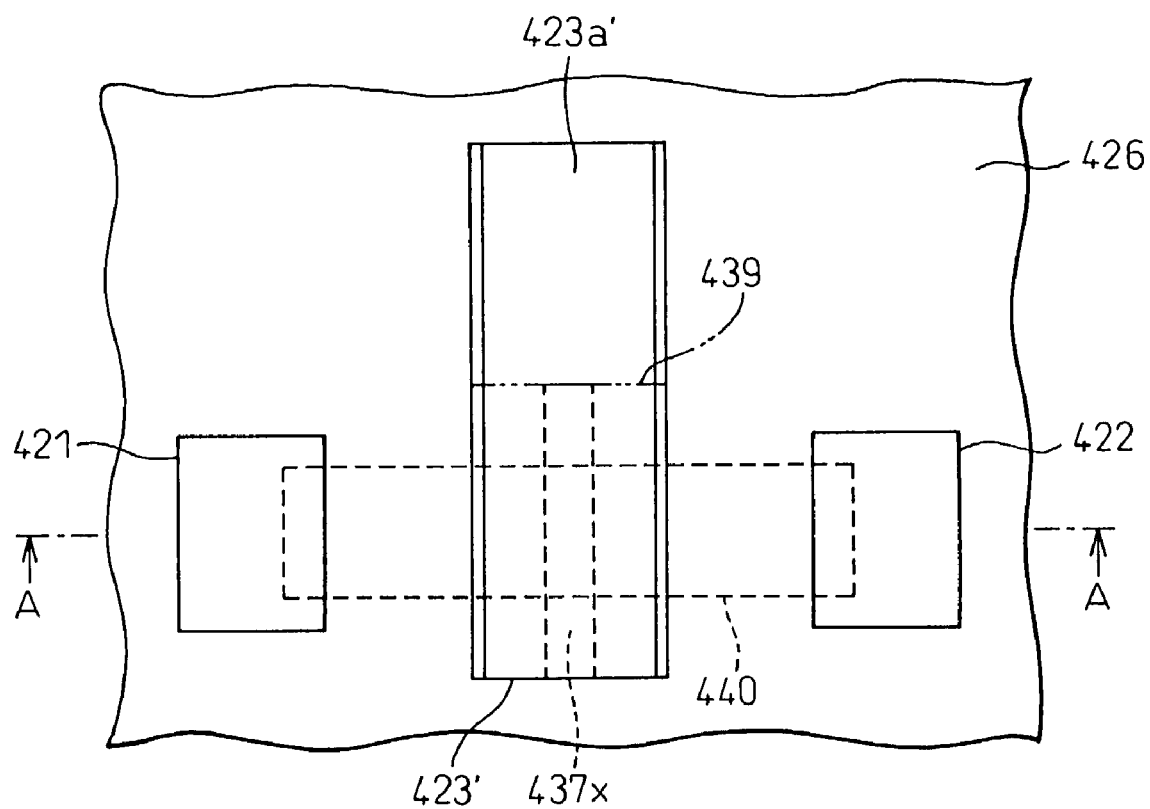
FIG. 30 is a top plan view schematically showing the conventional field effect transistor.

FIG. 30 is a top plan view schematically showing the conventional field effect transistor. This drawing and similar top plan views of the transistors to be referred to below, schematically show the source, the drain, the gate and the active area (the position of which is designated by numeral 440 in the drawing) making up basic component elements of the transistor.

FIG. 29 represents a sectional view taken on line A—A in FIG. 30. The portion of the hole 437 formed in the SiO$_2$ film 426 and the InP layer 416 thereunder (where the gate electrode for controlling the current of the transistor is to be located) shown in FIG. 28A corresponds to the portion designated by numeral 437x in FIG. 30. As apparent from the drawing, this portion is formed so as to transverse the active layer 440 of the field effect transistor. In FIG. 30, the portion 423a' of the area lacking the portion 437x (the area above the imaginary line 439) corresponds to the lead-out portion of the gate electrode.

Figure 31:
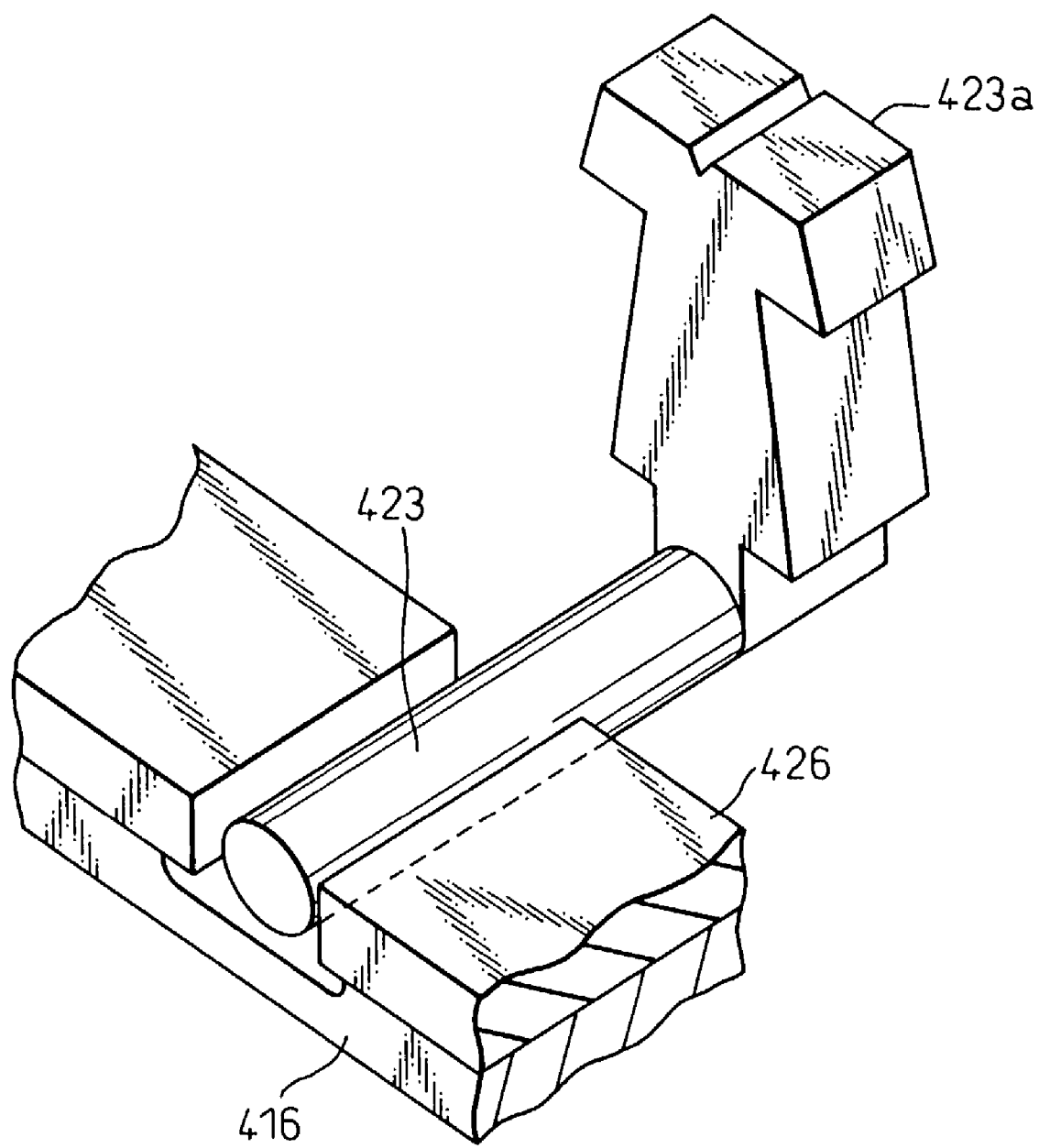
FIG. 31 is a perspective view illustrating the gate portion of a field effect transistor according to the invention.

The gate portion constituting the feature of the field effect transistor according to the invention described with reference to FIG. 25 is specifically shown in the perspective view of FIG. 31. The gate 423 is configured of the carbon nanotube (for simplification, indicated as a cylinder in this drawing and drawings subsequently referred to) which is at a location corresponding to the opening 435 of the SiO$_2$ film 426 (FIG. 28A) and the hole 437 (FIG. 28B) formed in the underlying InP layer 416. One end of the carbon nanotube is connected to the gate electrode lead-out portion 423a formed in the same way as the lead-out portion 423a' of the gate 423' of the conventional transistor described earlier. In this way, the carbon nanotube corresponding to the gate metal is structured in such a manner as to extend from the root of the gate electrode lead-out portion 423a.

Figure 32A:
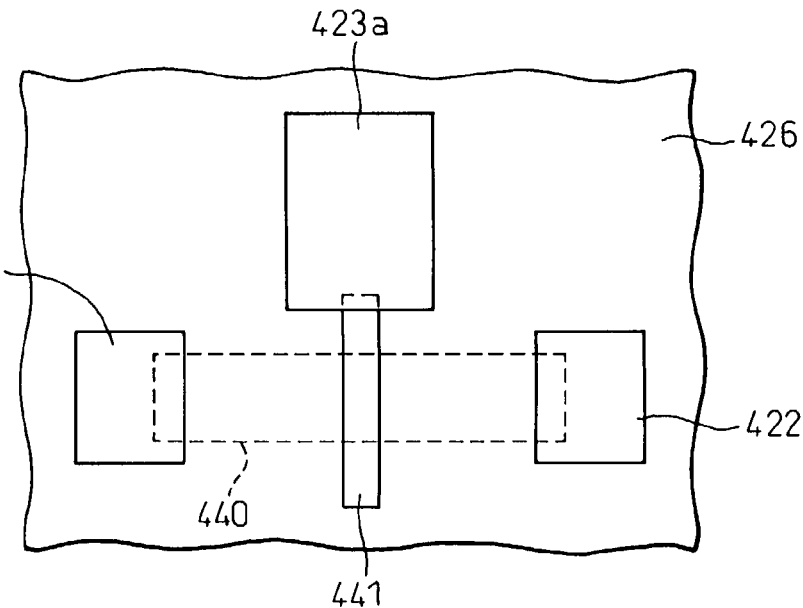
FIGS. 32A and 32B illustrate a part of the method for fabricating the gate of a field effect transistor according to the invention.
Figure 32B:
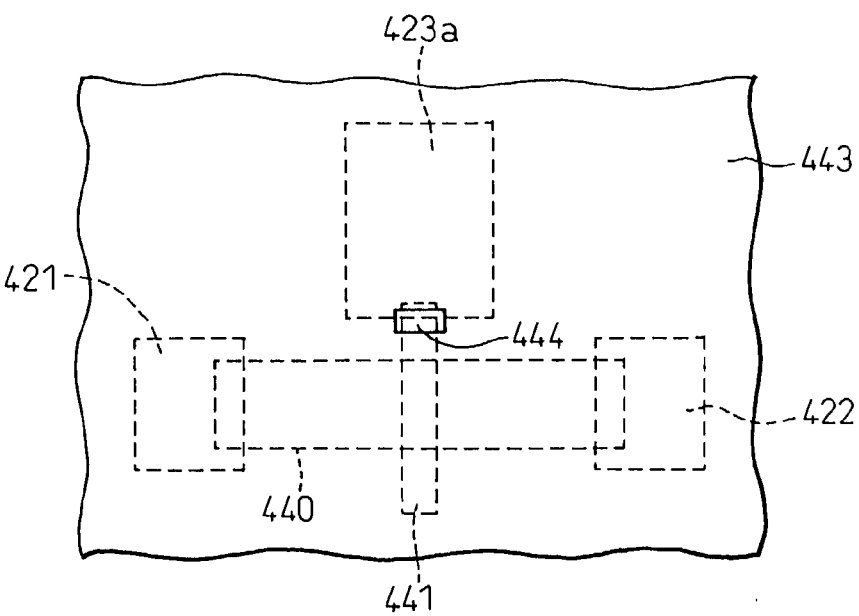
Figure 33:
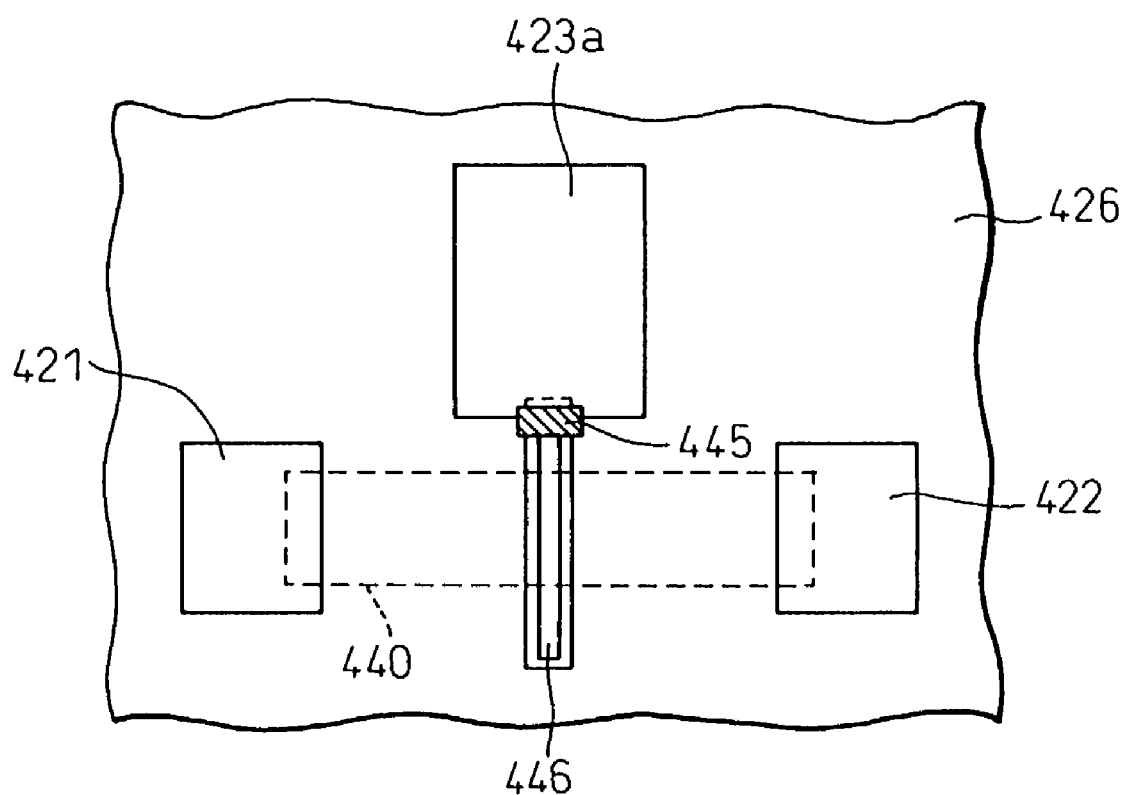
FIG. 33 illustrates the remaining part of the method for fabricating the gate of the field effect transistor according to the invention.

Fabrication of the field effect transistor according to an embodiment of the invention shown in FIG. 25 will be explained with reference to FIGS. 32 and 33. The gate electrode is formed in the same way as in the method described above with reference to FIGS. 27 to 29, after which gate metal is patterned to be removed from the area where the gate 423 (also called "the gate finger") (FIG. 31) of the carbon nanotube is to be formed, while leaving the gate electrode lead-out portion 423a intact, and the resist (not shown) used for this process is then removed (FIG. 32A). The groove designated by numeral 441 in FIG. 32A corresponds to the hole 437 in FIG. 28A, in which the gate of the carbon nanotube is to be formed. Another resist pattern 443 is formed as shown in FIG. 32B, and particulates of a transition metal such as Ni, Co or Fe making up a catalyst for fabrication of the carbon nanotube or particulates of an alloy of such transition metals is then deposited in the opening 444 connected to the root of the gate electrode lead-out portion 423a. The resist pattern 443 is removed, and as shown in FIG. 33, the carbon nanotube 446 constituting the gate finger is grown by the CVD process using the transition metal catalyst 445 deposited while controlling the direction of growth. The direction of growth can be controlled by thermal CVD while applying an electric field in the direction in which the carbon nanotube is to be grown. A DC electric field is used for this purpose.

Figure 34A:
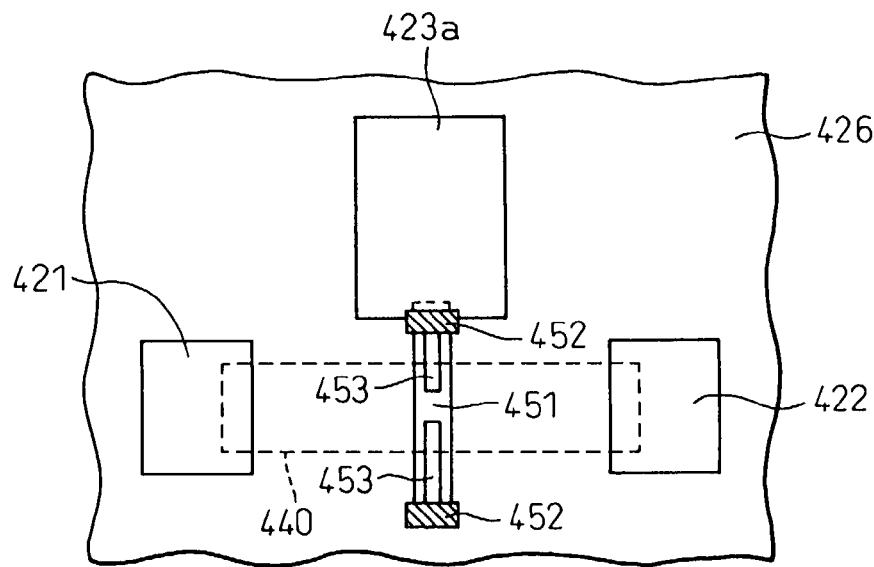
FIGS. 34A and 34B illustrate another method of fabricating the gate of a field effect transistor according to the invention.
Figure 34B:
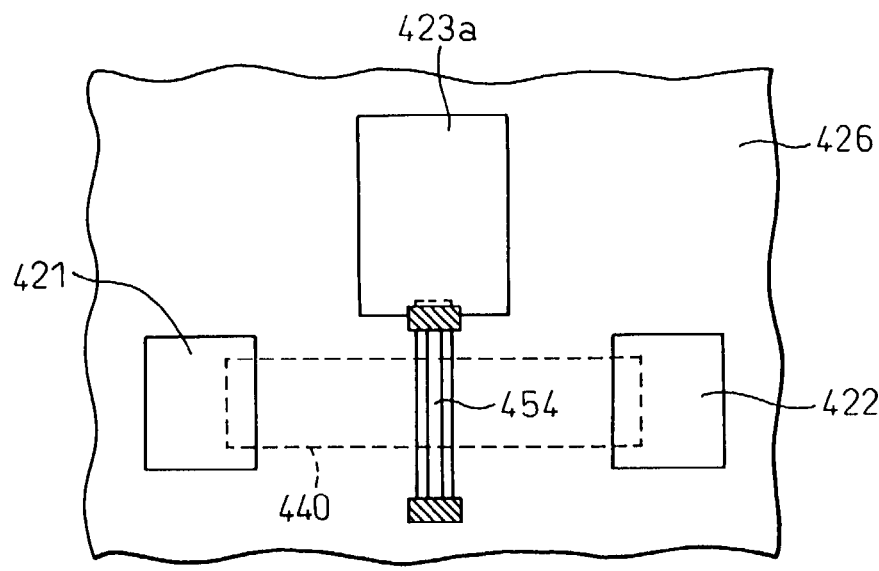

Another method of growing a carbon nanotube of the gate finger will be explained with reference to FIG. 34. As shown in FIG. 34A, a groove 451 for growing the carbon nanotube is formed in a $SiO_2$ film 426 and an underlying InP layer 416 (FIG. 25) in the same way as mentioned earlier, and a transition metal catalyst 452 is deposited at both ends of the groove 451. While applying an electric field, the carbon nanotubes 453 are then grown by the CVD process. In this case, an AC electric field is used so that the carbon nanotubes 453 grow from the two ends toward the center of the groove 451, and are finally connected to each other at the center, to form a single tube 454 (FIG. 34B).

With a field effect transistor according to still another embodiment of the invention, a carbon nanotube accommodated in the V-groove formed on the semiconductor substrate is used as a gate. In this case, the position and direction controllability of the grown carbon nanotube can be improved by growing the carbon nanotube within the V-groove formed in the semiconductor substrate. Using an InP substrate and etching this substrate by HCl gas using an insulating film as a mask enables the highly selective etching based on the difference in plane direction, thereby making it possible to form a sharp groove having a width of the order of nanometer. Further, taking advantage of the fact that carbon can be plated by a metal such as Ni, such a metal can be buried in the V-groove accommodating the carbon nanotube to thereby reduce the gate resistance.

This embodiment will be explained with reference to the drawings.

Figure 35A:
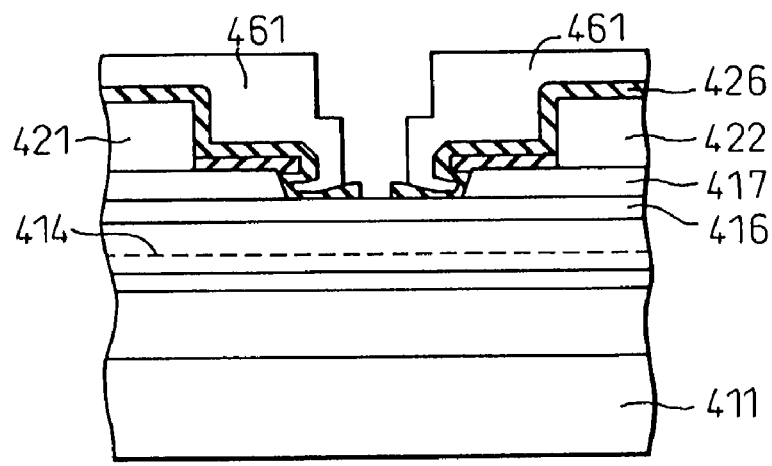
FIGS. 35A to 35C illustrate a part of the process for fabricating a field effect transistor having the HEMT structure according to another embodiment of the invention.

First, in the same manner as explained earlier with reference to FIGS. 27 and 28, a substrate is prepared having a source 421, a drain 422 and an insulating film 426 with an opening 435 (FIG. 28A) formed in the insulating film 426 of $SiO_2$. As shown in FIG. 35A, a resist pattern 461 for producing a gate is then formed, and the InP layer 416 is dry etched at high temperature using the HCl gas. In this process, the etching mask is not the resist pattern 461 but the $SiO_2$ insulating film 426 exposed in the opening thereof. The longitudinal direction (in which the carbon nanotube is grown later) of the opening pattern of the insulating film 426 is aligned with the orientation (110) of the InP layer 416 in advance. It has been found that by dry etching the InP layer 416 at high temperatures as described above, a groove having a V-shaped section with a very sharp V-shaped bottom can be automatically formed and that the (111)B plane of the InP crystal appears on the side surface of the V-groove.

Figure 39:
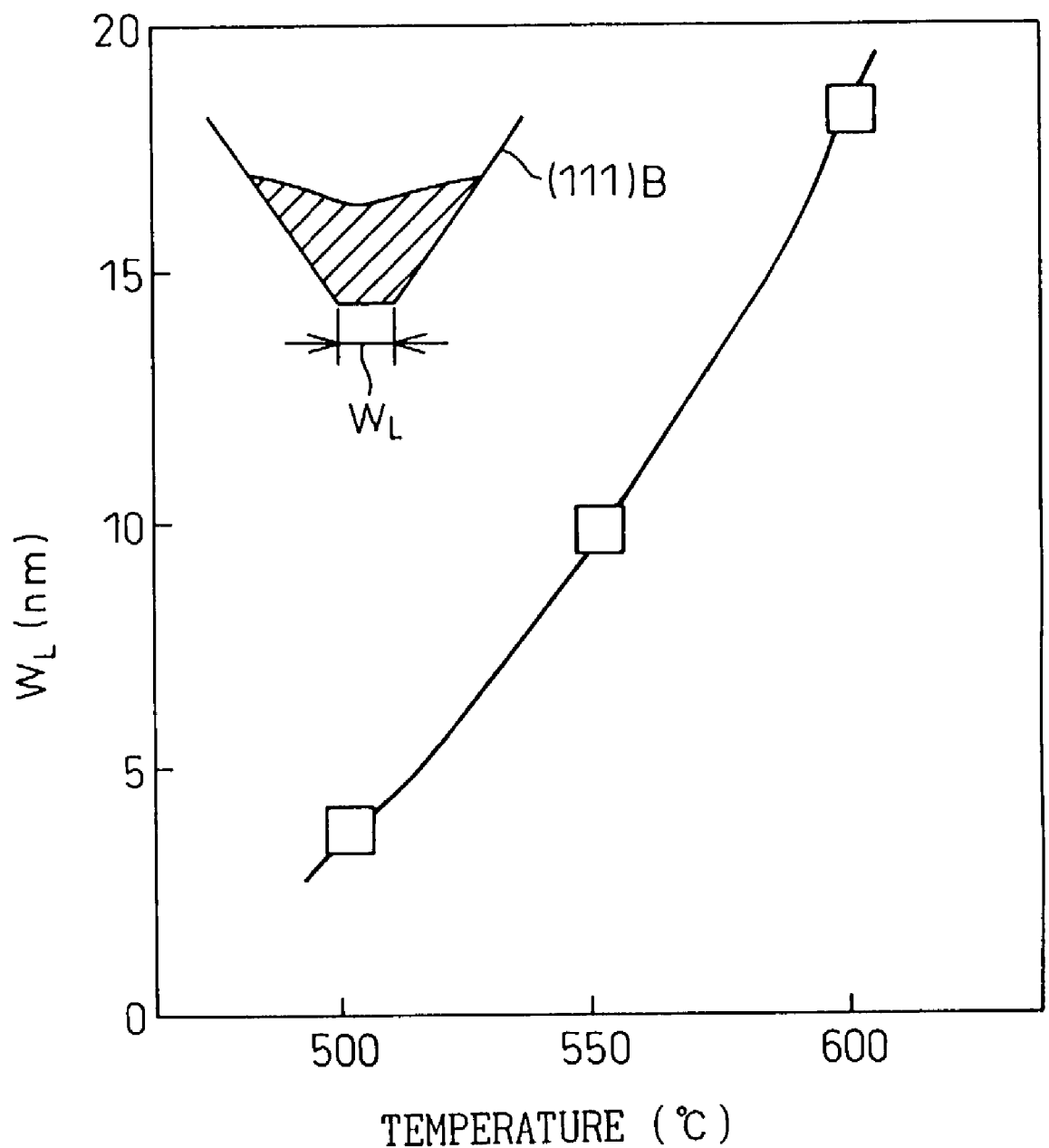
FIG. 39 is a graph showing the relation between the temperature and the width of the bottom surface of a V-groove observed in the case where the material is buried in the V-groove by MOCVD.

The feed gases for InP growth (trimethyl indium, phosphine, etc.) are then supplied to perform MOCVD of InP. No crystal grows on the (111)B plane of the side wall of the V-groove, but only on the bottom of the groove selectively. In this way, the sharp bottom of the groove can be buried. The width WL of the bottom surface of the V-groove thus formed can be controlled by the growth temperature, as shown in FIG. 39. By use of this technique, a groove 462 (FIG. 35B) can be obtained, which has a bottom surface of a width required for growing the carbon nanotube stably on the bottom surface of the V-groove later.

Figure 35B:
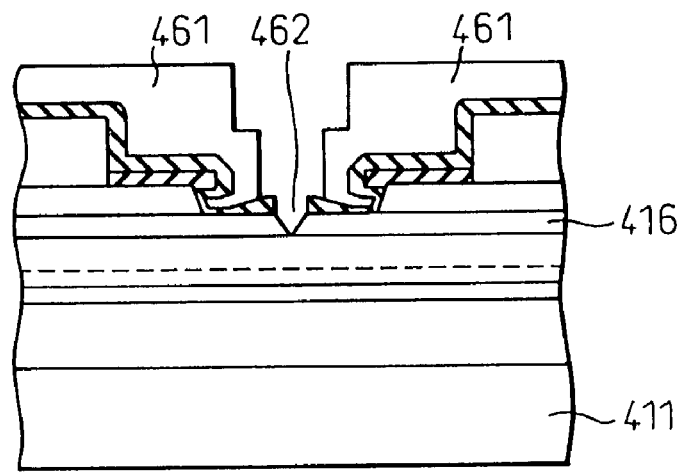
Figure 35C:
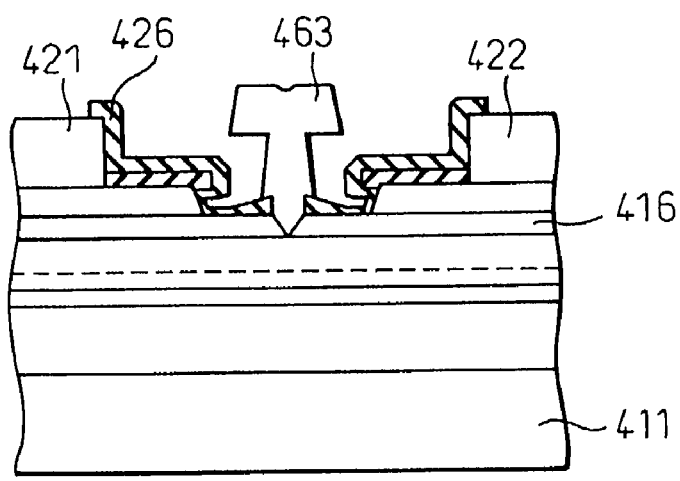

After forming the predetermined V-groove 462 (FIG. 35B) on the InP layer 416, a gate metal material is deposited using the resist pattern 461 as a mask, and a gate 463 is formed by the lift-off method as explained with reference to FIG. 29. A part of the $SiO_2$ film 426 is then etched off to thereby expose the source 421 and the drain 422 partially. The groove 441 for growing the carbon nanotube has a rectangular section in the embodiment explained above with reference to FIG. 32, while the present embodiment has the V-groove 462 (FIG. 35B). Except for this, the carbon nanotube 467 (FIG. 36) is grown in the V-groove 462 using an Ni metal catalyst 466 in the same manner as in the preceding embodiment. Before preparing the Ni metal catalyst 466, the gate metal in the area other than the portion to constitute the gate electrode lead-out portion 463a (FIG. 36) is removed. Herein, the controllability of the direction in which the carbon nanotube is to be grown is further improved by the growth of the carbon nanotube in and along the V-groove as well as the effect of the applied electric field.

Figure 36:
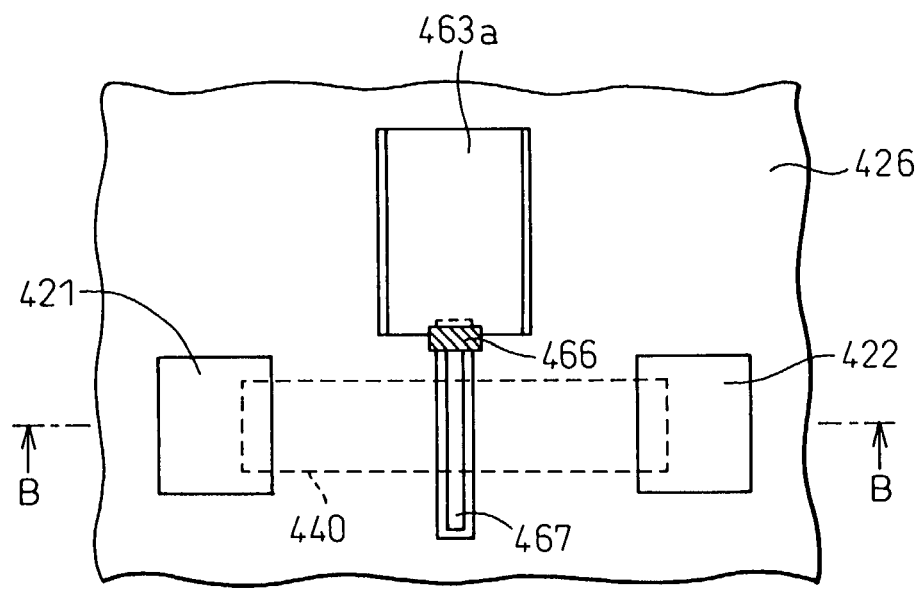
FIG. 36 illustrates the next part of the process for fabricating a field effect transistor having the HEMT structure according to the another embodiment of the invention.
Figure 37:
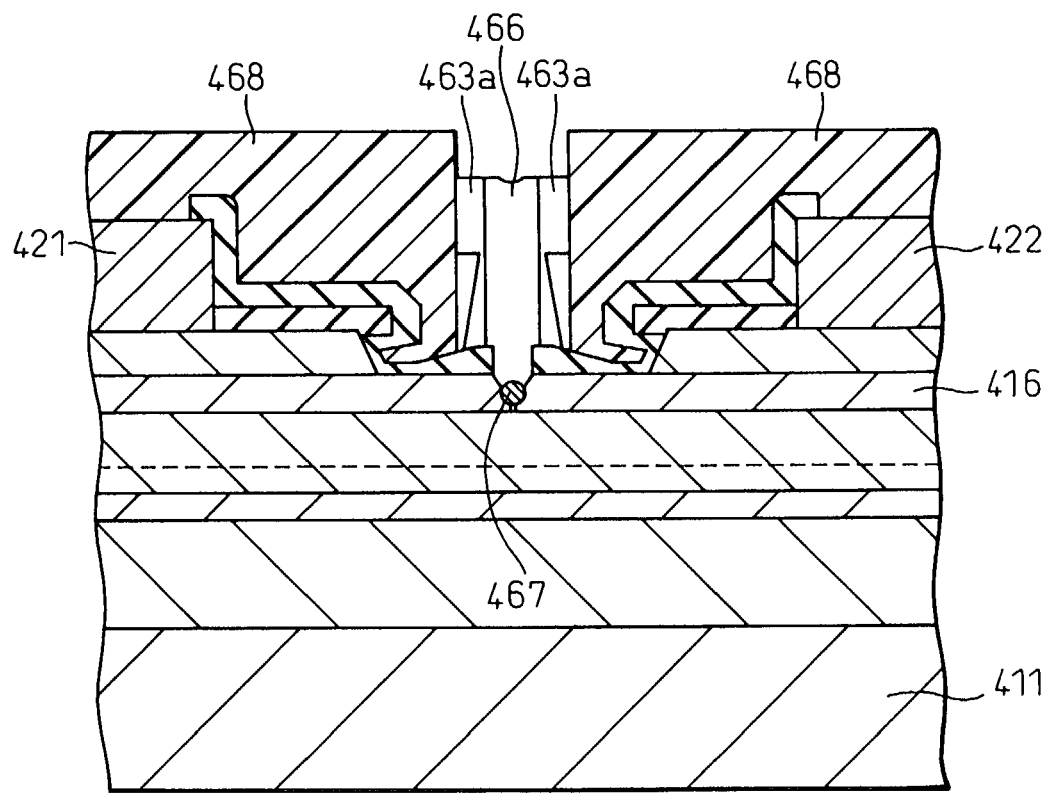
FIG. 37 illustrates the second next part of the process for fabricating a field effect transistor having the HEMT structure according to the another embodiment of the invention.
Figure 38:
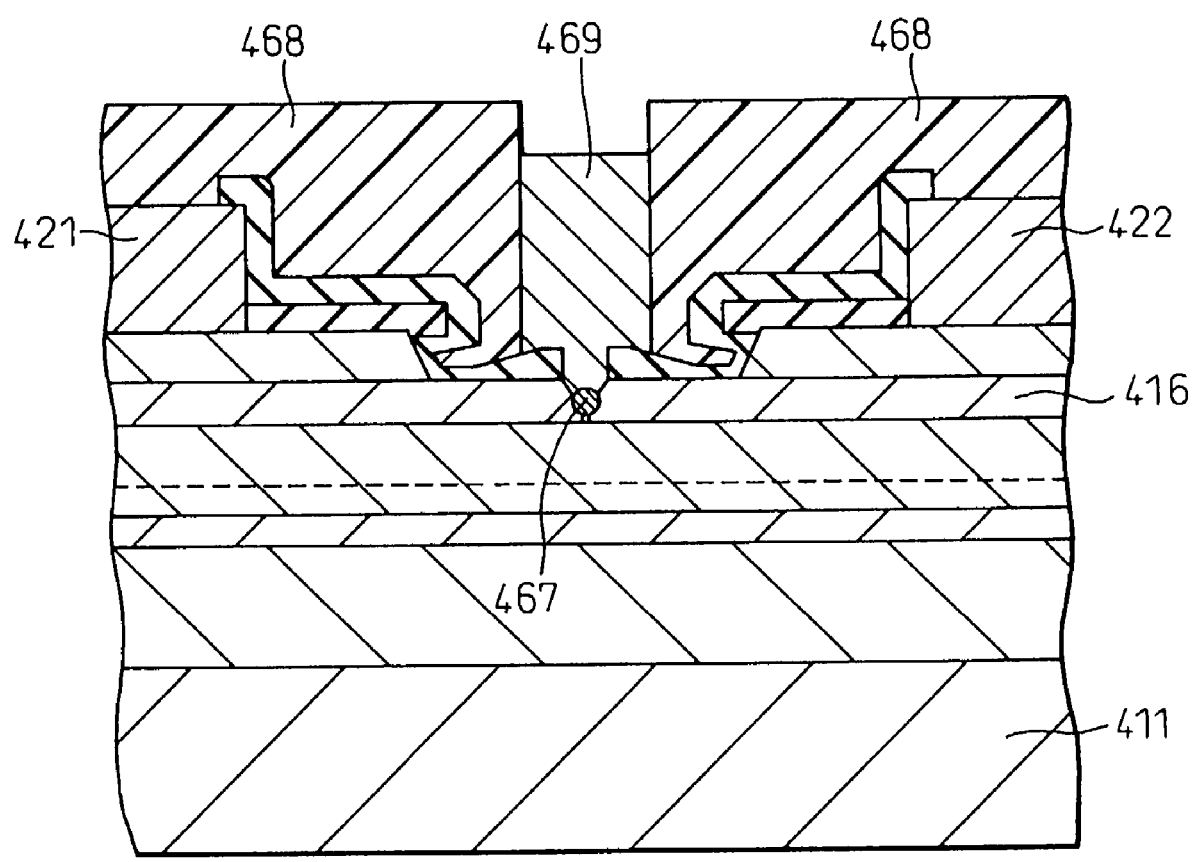
FIG. 38 illustrates the remaining part of the process for fabricating a field effect transistor having the HEMT structure according to the another embodiment of the invention.

FIG. 37 represents a sectional view taken in line B—B in FIG. 36, and shows a resist pattern 468 used later in the plating process for burying the Ni metal in the V-groove in which the nanotube 467 is present. Using this resist pattern 468 as a mask, the Ni electrolytic plating is conducted, so that the Ni metal 469 is buried in the V-groove as shown in FIG. 38, and then the resist pattern 468 is removed.

The carbon nanotube used in this invention has a minimum diameter of 0.4 nm, and therefore a gate length of not more than 10 nm indispensable for a future high-speed, high-frequency transistor can be realized by the invention.

The carbon nanotube having such a small diameter can also be used for a mask to fabricate a gate rather than for the formation of the gate itself of the transistor. This also makes it possible to realize a gate length of not more than 10 nm. In the case where a micro gate is fabricated using a resist pattern as a mask as in the prior art, the large dimensional fluctuations of the resist pattern makes it impossible to produce a satisfactory micro pattern successfully. On the other hand, the transfer of a mask pattern to the substrate layer by etching is not accompanied by large fluctuations, even at present. By using a carbon nanotube having very small dimensional or geometric fluctuations as a mask, therefore, a micro gate with correspondingly very small dimensional or geometric fluctuations can be obtained. The process for fabricating a gate using the carbon nanotube as a mask includes first growing a gate metal film on a semiconductor substrate or a gate insulating film, subsequently dry etching the gate metal film with a fluorine based gas such as $SF_6$ or $CF_4$, and then removing the mask of the carbon nanotube using the oxygen dry etch gas.

A method of fabricating a field effect transistor using the carbon nanotube as a mask according to this invention will be explained below with reference to the drawings.

Figure 40A:
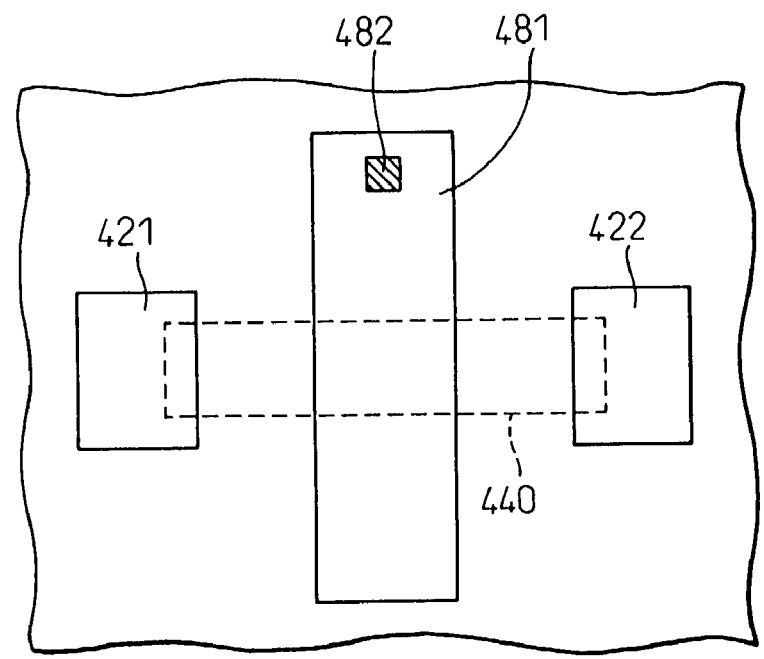
FIGS. 40A and 40B illustrate the first half of a method for forming a micro pattern according to the invention.
Figure 40B:
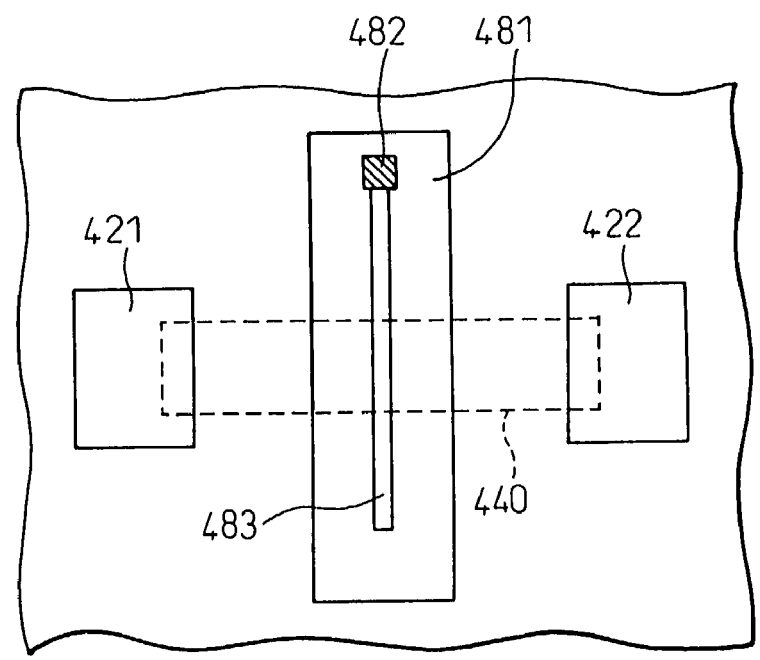
Figure 41A:
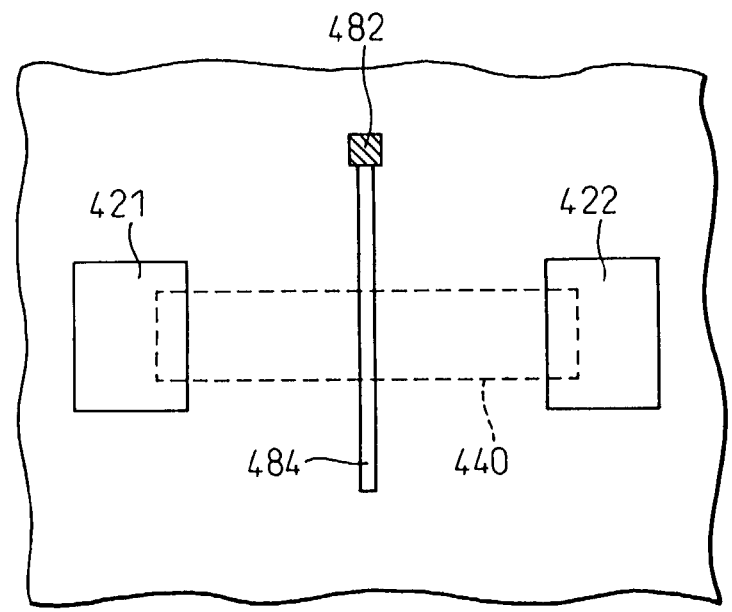
FIGS. 41A and 41B illustrate the second half of a method for forming a micro pattern according to the invention.
Figure 41B:
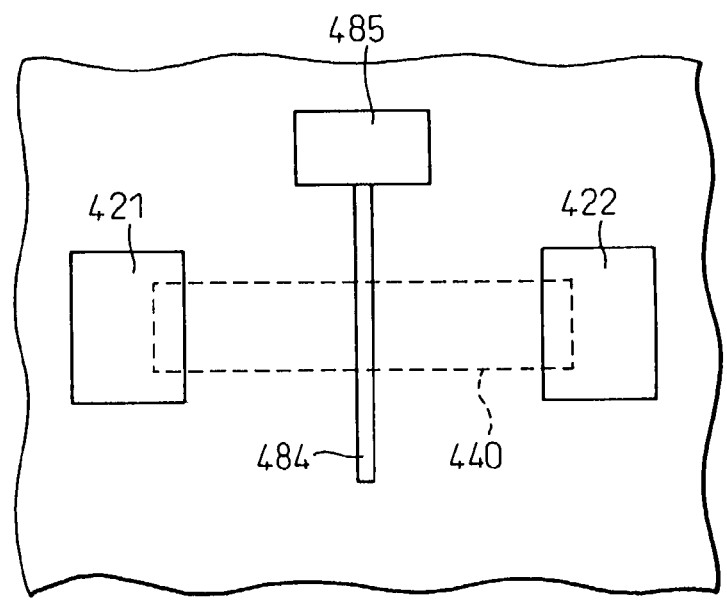

First, in the same manner as explained earlier with reference to FIGS. 27 and 28, a substrate is prepared having a source 421, a drain 422 and an insulating film 426 with an opening 437 (FIG. 28B) formed in the insulating film 426 and an underlying InP layer 416. As shown in FIG. 40A, a gate metal layer 481 is then formed, on which a Ni catalyst 482 for growing the carbon nanotube is prepared. Then, while applying a DC electric field, the thermal CVD is carried out to grow the carbon nanotube 483 (FIG. 40B). Using the carbon nanotube 483 thus obtained as a mask, the gate metal layer 481 is dry etched using $SF_6$, for example, and the carbon nanotube is removed by oxygen dry etching, thereby producing a gate 484 having a micro pattern formed of the metal (FIG. 41A). Then, a gate lead-out portion 485 (FIG. 41B) is formed at an end of the gate 484.

Using this method, dimensional fluctuations posing a problem in the lithography using a resist can be avoided even at a dimension of not greater than 10 nm, to thereby realize a high-speed, high-frequency transistor.

Apart from the HEMT used as an example for explaining the invention, the invention is of course applicable also to the various other transistors with equal effect. As an example, a field effect transistor according to the invention employing the gate of carbon nanotube may have either one or a plurality of gates. The carbon nanotube making up the gate can be grown either by the thermal CVD process referred to in the foregoing description or by plasma CVD. In the case of the thermal CVD process, the catalyst remains at the origin of growth, while in the case of plasma CVD, the catalyst is located at the forward end of the growing tube and moves with the tube growth. It can also be easily understood that the method of forming a micro pattern using the carbon nanotube as a mask is applicable not only to the fabrication of a gate but also to the patterning of, for instance, a $SiO_2$ insulating film. In any case, an appropriate etching gas should be selected, depending on the carbon nanotube constituting a mask and the material to be patterned. For etching a metal film, for example, $SF_6$, $CF_4$ or the like may be used, while $CHF_3$ or the like can be a choice for patterning a silicon oxide film.

It will thus be understood from the foregoing description that according to this invention, there is provided a field effect transistor having a micro gate free of dimensional fluctuations. Also, according to this invention, there is provided a method of forming a micro pattern which makes it possible to form a micro structure including the micro gate described above.

The invention claimed is:

1. An integrated circuit device comprising:
a plurality of elements fabricated on a semiconductor substrate,
wiring lines in separate layers of the integrated circuit device that enable the elements and the integrated circuit device to operate,
an insulation layer formed between the layers of wiring lines, and
vias interconnecting the wiring lines of different layers and the vias being located within openings in the insulation layer, each via being formed of one or more cylindrical structures made up of carbon atoms grown from one of the wiring lines, wherein the insulation layer surrounds the vias
wherein each via is formed of a bundle of a plurality of cylindrical structures made up of carbon atoms, each cylindrical structure being constructed of a plurality of cylindrical bodies having different sizes and being arranged coaxially.

2. The integrated circuit device of claim 1, wherein each via is formed of a single cylindrical structure made up of carbon atoms.

3. The integrated circuit device of claim 1, wherein each via is formed of a plurality of cylindrical structures made up of carbon atoms.

4. The integrated circuit device of claim 1, wherein each of the one or more cylindrical structures is formed of a single cylindrical body.

5. The integrated circuit device of claim 1, wherein each of the one or more cylindrical structures is formed of a plurality of coaxially arranged cylindrical bodies.

6. The integrated circuit device of claim 2, wherein the single cylindrical structure is formed of a single cylindrical body.

7. The integrated circuit device of claim 2, wherein the single cylindrical structure is formed of a plurality of coaxially arranged cylindrical bodies.

8. The integrated circuit device of claim 3, wherein each of the cylindrical structures is formed of a single cylindrical body.

9. The integrated circuit device of claim 3, wherein each of the cylindrical structures is formed of a plurality of coaxially arranged cylindrical bodies.

10. The integrated circuit device of claim 3, wherein the plurality of cylindrical structures comprises, in combination, one or more cylindrical structures formed of a single cylindrical body and one or more cylindrical structures formed of a plurality of coaxially arranged cylindrical bodies.

11. The integrated circuit device of claim 1, wherein each bundle having the plurality of cylindrical structures comprises, in combination, one or more cylindrical structures formed of a single cylindrical body and one or more cylindrical structures formed of a plurality of coaxially arranged cylindrical bodies.

12. The integrated circuit device of claim 1, further comprising an insulation layer surrounding each via, the insulation layer being formed of a silicon-based insulation material or a porous material.

13. The integrated circuit device of claim 1, wherein a side of each via is exposed.

14. The integrated circuit device of claim 1, wherein some of the vias have a junction structure comprising a cylindrical structure with metallic properties and another cylindrical structure with semiconductor properties.

15. The integrated circuit device of claim 1, further comprising components exhibiting metallic properties that are located either in the one or more cylindrical structures or between neighboring ones of the one or more cylindrical structures, or are located both in the one or more cylindrical structures or between neighboring ones of the one or more cylindrical structures.

16. The integrated circuit device of claim 1, wherein each of the one or more cylindrical structures is a carbon nanotube.

17. The integrated circuit device of claim 1, wherein each wiring member is exposed.

18. An integrated circuit device comprising:
a plurality of elements fabricated on a semiconductor substrate,
wiring members enabling the elements and the integrated circuit device to operate, at least a part of the wiring members being formed of one or more cylindrical structures made up of carbon atoms, with some of the wiring members being horizontal to the semiconductor substrate, wherein each wiring member is formed of a bundle of a plurality of cylindrical structures made up of carbon atoms, each cylindrical structure being constructed of a plurality of cylindrical bodies having different sizes and being arranged coaxially;

an insulation layer formed between the wiring members; and vias interconnecting the wiring members and formed in openings in the insulation layer, wherein the insulation layer surrounds the vias.

19. The integrated circuit device of claim 18, wherein each wiring member is formed of a single cylindrical structure made up of carbon atoms.

20. The integrated circuit device of claim 18, wherein each wiring member is formed of a plurality of cylindrical structures made up of carbon atoms.

21. The integrated circuit device of claim 18, wherein each of the one or more cylindrical structures is formed of a single cylindrical body.

22. The integrated circuit device of claim 18, wherein each of the one or more cylindrical structures is formed of a plurality of coaxially arranged cylindrical bodies.

23. The integrated circuit device of claim 19, wherein the single cylindrical structure is formed of a single cylindrical body.

24. The integrated circuit device of claim 19, wherein the single cylindrical structure is formed of a plurality of coaxially arranged cylindrical bodies.

25. The integrated circuit device of claim 20, wherein each of the cylindrical structures is formed of a single cylindrical body.

26. The integrated circuit device of claim 20, wherein each of the cylindrical structures is formed of a plurality of coaxially arranged cylindrical bodies.

27. The integrated circuit device of claim 20, wherein the plurality of cylindrical structures comprises, in combination, one or more cylindrical structures formed of a single cylindrical body and one or more cylindrical structures formed of a plurality of coaxially arranged cylindrical bodies.

28. The integrated circuit device of claim 18, wherein each bundle having the plurality of cylindrical structures comprises, in combination, one or more cylindrical structures formed of a single cylindrical body and one or more cylindrical structures formed of a plurality of coaxially arranged cylindrical bodies.

29. The integrated circuit device of claim 18, further comprising an insulation layer surrounding each wiring member, the insulation layer being formed of a porous material.

30. The integrated circuit device of claim 18, wherein part of the wiring members are exposed, and the remainder of the wiring members is embedded in an insulation material.

31. The integrated circuit device of claim 30, wherein the insulation material is porous.

32. The integrated circuit device of claim 18, wherein some of the wiring members have a junction structure comprising a cylindrical structure with metallic properties and another cylindrical structure with semiconductor properties.

33. The integrated circuit device of claim 18, wherein each of the one or more cylindrical structures is a carbon nanotube.

34. An integrated circuit device comprising:
a plurality of elements fabricated on a semiconductor substrate,
first and second layers of wiring lines enabling the elements and the integrated circuit device to operate;
an insulation layer formed between the first and second layers of wiring lines, the insulation layer having an opening; and
a via interconnecting the first and second layers of wiring lines and formed of one or more cylindrical structures made up of carbon atoms grown from one of the first and second layers of wiring lines, the via being located within the opening of the insulation layer, wherein the insulation layer surrounds the via, wherein the via is formed of a bundle of a plurality of cylindrical structures made up of carbon atoms, each cylindrical structure being constructed of a plurality of cylindrical bodies having different sizes and being arranged coaxially.

35. The integrated circuit device of claim 34, wherein the via is formed of a single cylindrical structure made up of carbon atoms.

36. The integrated circuit device of claim 34, wherein the via is formed of a plurality of cylindrical structures made up of carbon atoms.

37. The integrated circuit device of claim 34, wherein each of the one or more cylindrical structures is formed of a single cylindrical body.

38. The integrated circuit device of claim 34, wherein each of the one or more cylindrical structures is formed of a plurality of coaxially arranged cylindrical bodies.

39. The integrated circuit device of claim 35, wherein the single cylindrical structure is formed of a single cylindrical body.

40. The integrated circuit device of claim 35, wherein the single cylindrical structure is formed of a plurality of coaxially arranged cylindrical bodies.

41. The integrated circuit device of claim 36, wherein each of the cylindrical structures is formed of a single cylindrical body.

42. The integrated circuit device of claim 36, wherein each of the cylindrical structures is formed of a plurality of coaxially arranged cylindrical bodies.

43. The integrated circuit device of claim 36, wherein the plurality of cylindrical structures comprises, in combination, one or more cylindrical structures formed of a single cylindrical body and one or more cylindrical structures formed of a plurality of coaxially arranged cylindrical bodies.

44. The integrated circuit device of claim 34, wherein the bundle comprises, in combination, one or more cylindrical structures formed of a single cylindrical body and one or more cylindrical structures formed of a plurality of coaxially arranged cylindrical bodies.

45. The integrated circuit device of claim 34, wherein the insulation layer is formed of a silicon-based insulation material or a porous material.

46. The integrated circuit device of claim 34, wherein a side of the via is exposed.

47. The integrated circuit device of claim 34, wherein the via has a junction structure comprising a cylindrical structure with metallic properties and another cylindrical structure with semiconductor properties.

48. The integrated circuit device of claim 34, further comprising components exhibiting metallic properties that are located either in the one or more cylindrical structures or between neighboring ones of the one or more cylindrical structures, or are located both in the one or more cylindrical structures or between neighboring ones of the one or more cylindrical structures.

49. The integrated circuit device of claim 34, wherein each of the one or more cylindrical structures is a carbon nanotube.

50. An apparatus comprising:
an integrated circuit including
first and second layers of wiring lines,
an insulation layer formed between the first and second layers of wiring lines, the insulation layer having an opening, and
a via interconnecting the first and second layers of wiring lines and formed of one or more cylindrical structures made up of carbon atoms grown from one of the first and second layers of wiring lines, the via being located within the opening of the insulation layer, wherein the insulation layer surrounds the via wherein the via is formed of a bundle of a plurality of cylindrical structures made up of carbon atoms, each cylindrical structure being constructed of a plurality of cylindrical bodies having different sizes and being arranged coaxially.

51. The apparatus of claim 50, wherein the via is formed of a single cylindrical structure made up of carbon atoms.

52. The apparatus of claim 50, wherein the via is formed of a plurality of cylindrical structures made up of carbon atoms.

53. The apparatus of claim 50, wherein each of the one or more cylindrical structures is formed of a single cylindrical body.

54. The apparatus of claim 50, wherein each of the one or more cylindrical structures is formed of a plurality of coaxially arranged cylindrical bodies.

55. The apparatus of claim 51, wherein the single cylindrical structure is formed of a single cylindrical body.

56. The apparatus of claim 51, wherein the single cylindrical structure is formed of a plurality of coaxially arranged cylindrical bodies.

57. The apparatus of claim 52, wherein each of the cylindrical structures is formed of a single cylindrical body.

58. The apparatus of claim 52, wherein each of the cylindrical structures is formed of a plurality of coaxially arranged cylindrical bodies.

59. The apparatus of claim 52, wherein the plurality of cylindrical structures comprises, in combination, one or more cylindrical structures formed of a single cylindrical body and one or more cylindrical structures formed of a plurality of coaxially arranged cylindrical bodies.

60. The apparatus of claim 50, wherein the bundle comprises, in combination, one or more cylindrical structures formed of a single cylindrical body and one or more cylindrical structures formed of a plurality of coaxially arranged cylindrical bodies.

61. The apparatus of claim 50, wherein the insulation layer is formed of a silicon-based insulation material or a porous material.

62. The apparatus of claim 50, wherein a side of the via is exposed.

63. The apparatus of claim 50, wherein the via has a junction structure comprising a cylindrical structure with metallic properties and another cylindrical structure with semiconductor properties.

64. The apparatus of claim 50, further comprising components exhibiting metallic properties that are located either in the one or more cylindrical structures or between neighboring ones of the one or more cylindrical structures, or are located both in the one or more cylindrical structures or between neighboring ones of the one or more cylindrical structures.

65. The apparatus of claim 50, wherein each of the one or more cylindrical structures is a carbon nanotube.

66. An integrated circuit device comprising:
a semiconductor substrate;
a plurality of elements fabricated on the semiconductor substrate,
wiring members enabling the elements and the integrated circuit device to operate, at least one of the wiring members being formed of one or more cylindrical structures made up of carbon atoms, with some of the wiring members being horizontal to the semiconductor substrate;
an insulation layer formed between the wiring members; and
a via interconnecting the wiring members and formed in an opening in the insulation layer, wherein the insulation layer surrounds the via, wherein each wiring member is formed of a bundle of a plurality of cylindrical structures made up of carbon atoms, each cylindrical structure being constructed of a plurality of cylindrical bodies having different sizes and being arranged coaxially.

67. The integrated circuit device of claim 66, wherein each wiring member is formed of a single cylindrical structure made up of carbon atoms.

68. The integrated circuit device of claim 66, wherein each wiring member is formed of a plurality of cylindrical structures made up of carbon atoms.

69. The integrated circuit device of claim 66, wherein each of the one or more cylindrical structures is formed of a single cylindrical body.

70. The integrated circuit device of claim 66, wherein each of the one or more cylindrical structures is formed of a plurality of coaxially arranged cylindrical bodies.

71. The integrated circuit device of claim 67, wherein the single cylindrical structure is formed of a single cylindrical body.

72. The integrated circuit device of claim 67, wherein the single cylindrical structure is formed of a plurality of coaxially arranged cylindrical bodies.

73. The integrated circuit device of claim 68, wherein each of the cylindrical structures is formed of a single cylindrical body.

74. The integrated circuit device of claim 68, wherein each of the cylindrical structures is formed of a plurality of coaxially arranged cylindrical bodies.

75. The integrated circuit device of claim 68, wherein the plurality of cylindrical structures comprises, in combination, one or more cylindrical structures formed of a single cylindrical body and one or more cylindrical structures formed of a plurality of coaxially arranged cylindrical bodies.

76. The integrated circuit device of claim 66, wherein each bundle comprises, in combination, one or more cylindrical structures formed of a single cylindrical body and one or more cylindrical structures formed of a plurality of coaxially arranged cylindrical bodies.

77. The integrated circuit device of claim 66, wherein the insulation layer is formed of a porous material.

78. The integrated circuit device of claim 66, wherein each wiring member is exposed.

79. The integrated circuit device of claim 66, wherein part of the wiring members are exposed, and the remainder of the wiring members is embedded in an insulation material.

80. The integrated circuit device of claim 79, wherein the insulation material is porous.

81. The integrated circuit device of claim 66, wherein some of the wiring members have a junction structure comprising a cylindrical structure with metallic properties and another cylindrical structure with semiconductor properties.

82. The integrated circuit device of claim 66, wherein each of the one or more cylindrical structures is a carbon nanotube.

* * * * *

UNITED STATES PATENT AND TRADEMARK OFFICE
CERTIFICATE OF CORRECTION

PATENT NO. : 7,084,507 B2 Page 1 of 1
APPLICATION NO. : 10/107480
DATED : August 1, 2006
INVENTOR(S) : Yuji Awano It is certified that error appears in the above-identified patent and that said Letters Patent is hereby corrected as shown below:

Column 23, Line 65, after "vias" insert --,--.

Column 27, Line 15, after "via" insert --,--.

Signed and Sealed this

Twenty-sixth Day of December, 2006

JON W. DUDAS
*Director of the United States Patent and Trademark Office*